United States Patent [19]
Hata

[11] Patent Number: 6,111,275
[45] Date of Patent: Aug. 29, 2000

[54] GALLIUM NITRIDE GROUP COMPOUND SEMICONDUCTOR LIGHT-EMITTING DEVICE AND METHOD FOR FABRICATING THE SAME

[75] Inventor: Toshio Hata, Nara, Japan

[73] Assignee: Sharp Kabushiki Kaisha, Japan

[21] Appl. No.: 08/923,655

[22] Filed: Sep. 4, 1997

[30] Foreign Application Priority Data

Sep. 6, 1996 [JP] Japan ..................................... 8-237049

[51] Int. Cl.[7] .............................. H01S 3/19; H01L 33/00
[52] U.S. Cl. .............................. 257/97; 257/103; 257/76; 257/101; 372/45; 372/46
[58] Field of Search ............................... 257/96, 97, 101, 257/103, 76, 13; 372/45, 46

[56] References Cited

U.S. PATENT DOCUMENTS

| | | | |
|---|---|---|---|
| 5,432,808 | 7/1995 | Hatano et al. . | |
| 5,446,753 | 8/1995 | Yoshida | 372/46 |
| 5,518,954 | 5/1996 | Yoo et al. . | |
| 5,539,762 | 7/1996 | Belenky et al. | 372/46 |
| 5,587,334 | 12/1996 | Naito et al. | 438/43 |
| 5,751,756 | 5/1998 | Takayama et al. | 372/46 |
| 5,835,516 | 11/1998 | Miyashita et al. | 372/46 |

FOREIGN PATENT DOCUMENTS

| | | |
|---|---|---|
| 2-194683 | 8/1990 | Japan . |
| 3-62585 | 3/1991 | Japan . |
| 7-249820 | 9/1995 | Japan . |
| 8-64866 | 3/1996 | Japan . |
| 8-97507 | 4/1996 | Japan . |

*Primary Examiner*—John Guay
*Attorney, Agent, or Firm*—Morrison & Foerster LLP

[57] ABSTRACT

A gallium nitride group compound semiconductor light-emitting device comprises a substrate and a layered structure provided on the substrate. The layered structure includes: an active layer; an upper cladding layer and a lower cladding layer which is located closer to the substrate than the upper cladding layer, the active layer interposed between the cladding layers; an internal current constricting layer having an opening for constricting a current within a selected region of the active layer, the internal current constricting layer being provided on the upper cladding layer; a surface protecting layer for covering the internal current constricting layer and an exposed surface of the upper cladding layer in the opening of the internal current constricting layer; and a regrowth layer provided on the surface protecting layer. The surface protecting layer serves as a protecting layer for the upper cladding layer and the internal current constricting layer in a step of forming the regrowth layer.

10 Claims, 29 Drawing Sheets

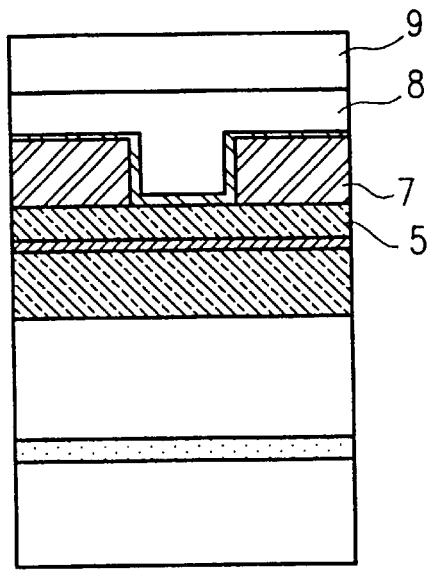
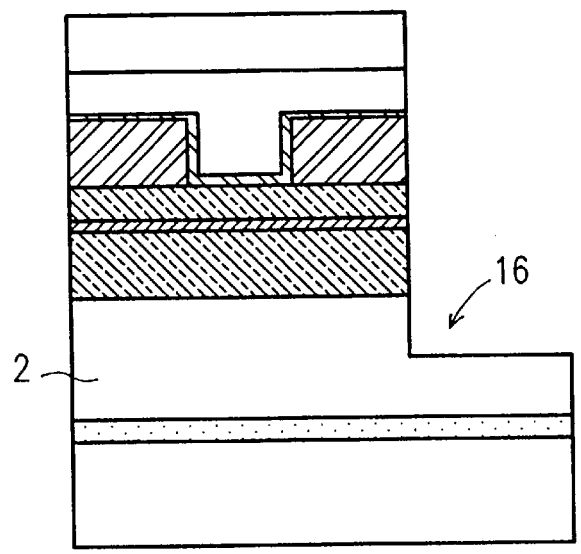
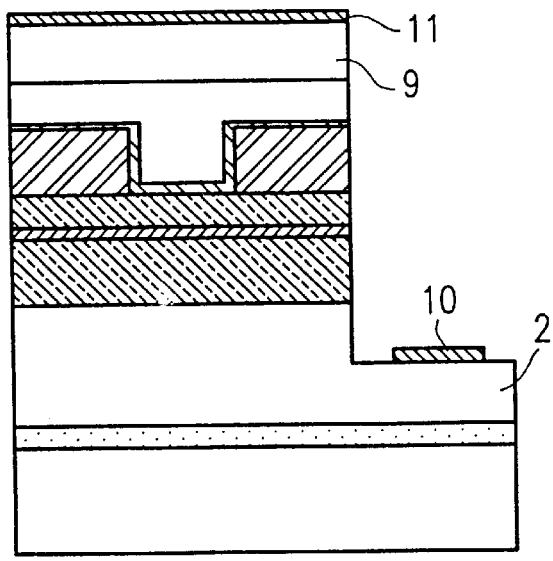

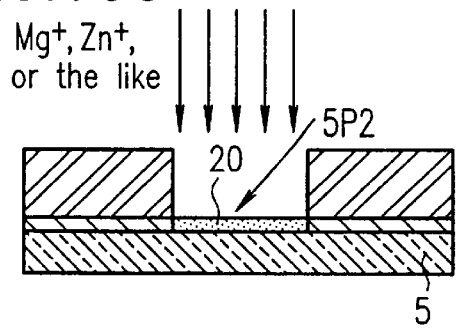
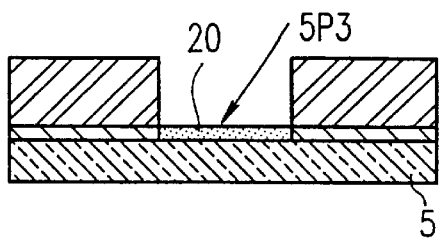
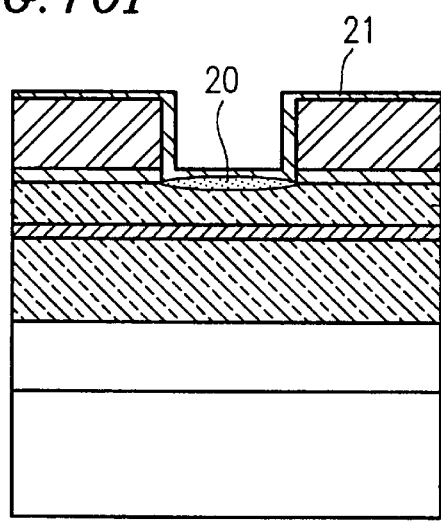
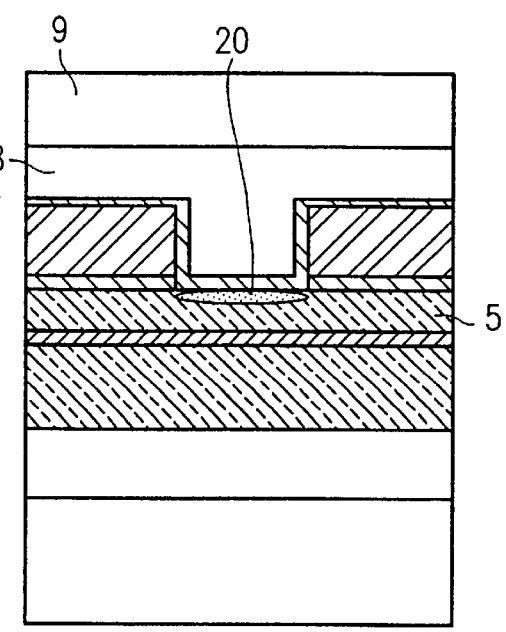
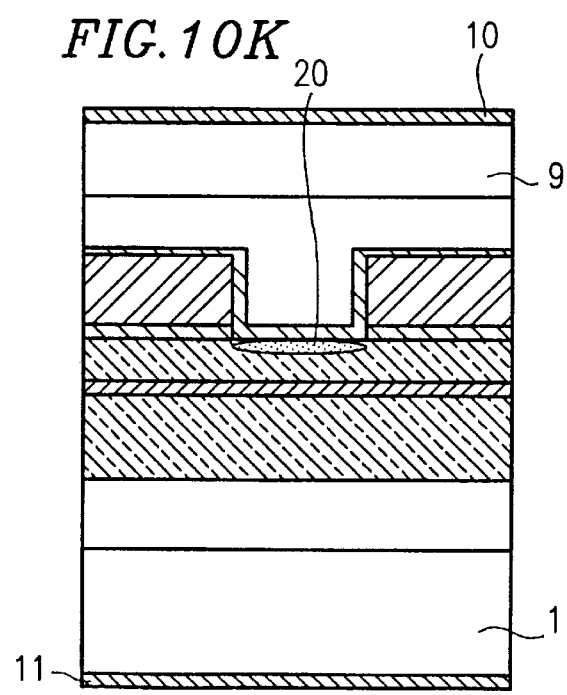

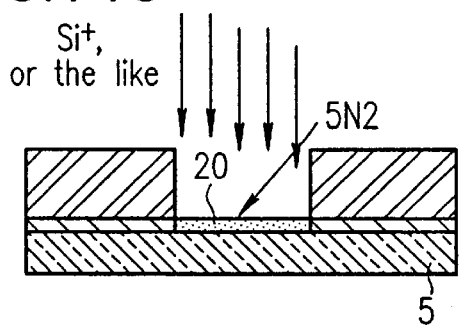
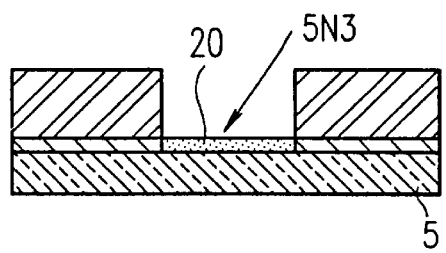
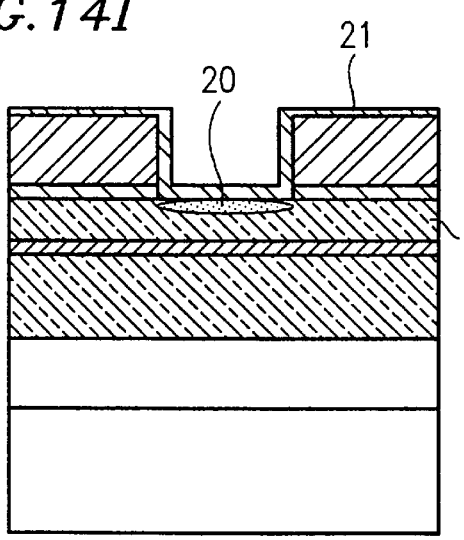
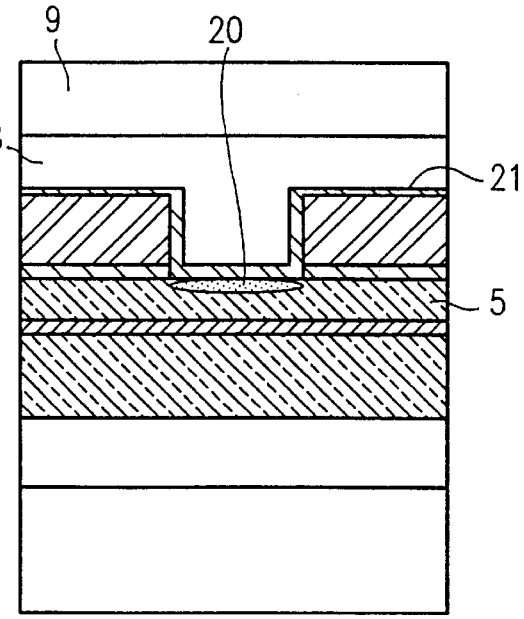
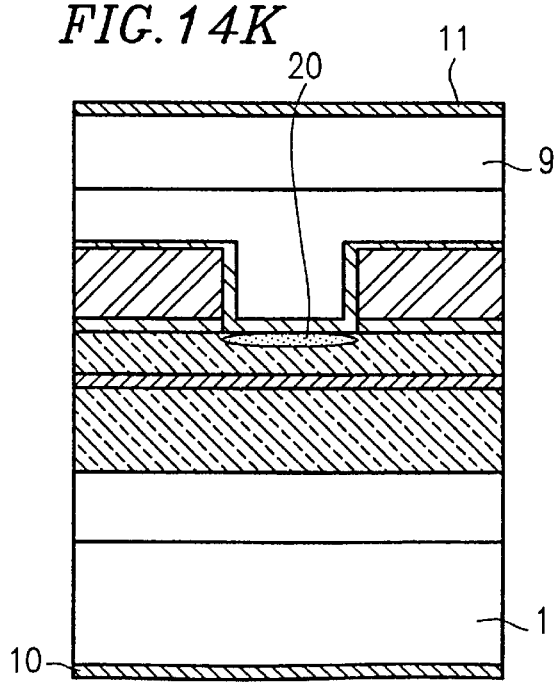

FIG. 16H
FIG. 16I
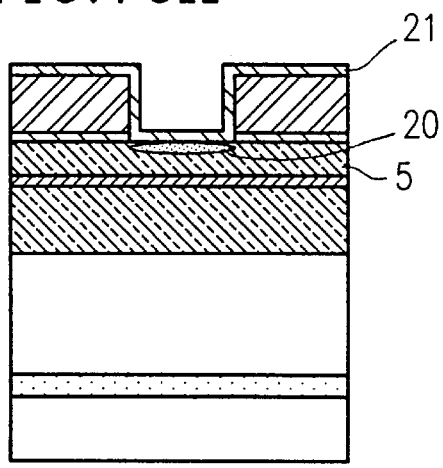
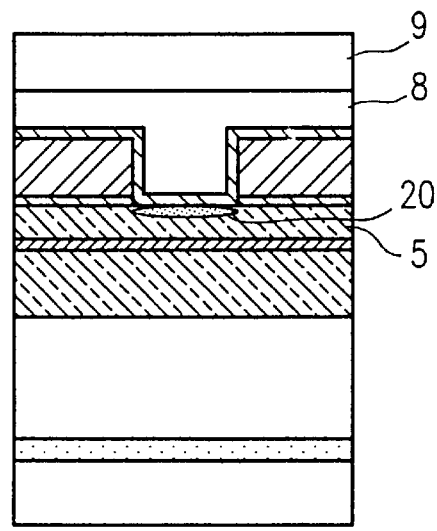
FIG. 16J
FIG. 16K
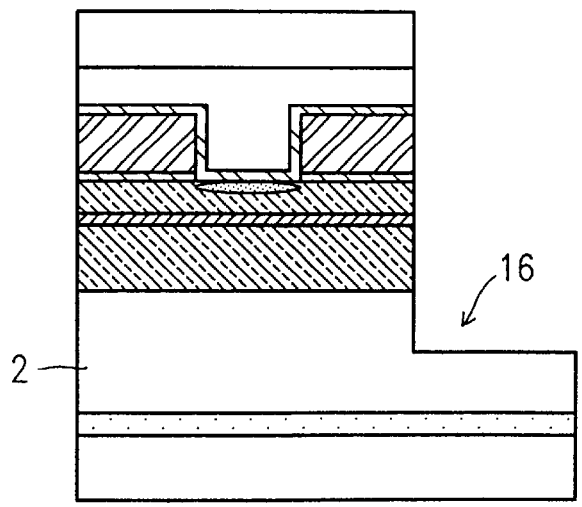
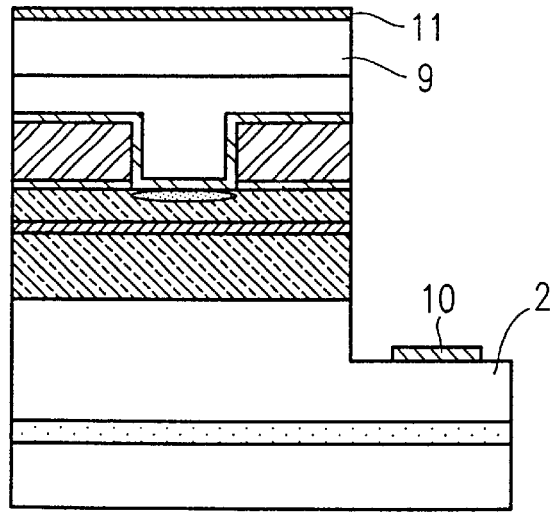

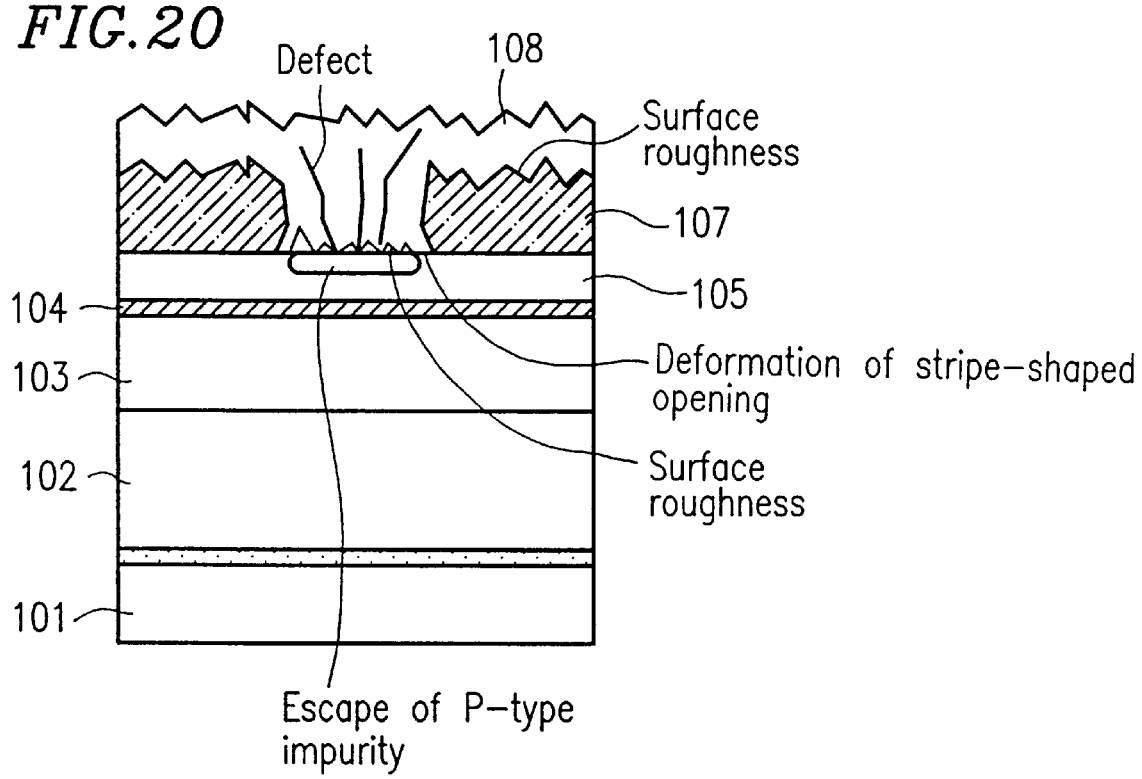

GALLIUM NITRIDE GROUP COMPOUND SEMICONDUCTOR LIGHT-EMITTING DEVICE AND METHOD FOR FABRICATING THE SAME

BACKGROUND OF THE INVENTION

1. Field of the Invention

The present invention relates to a gallium nitride group compound semiconductor light-emitting device, which is capable of emitting light from the blue region to the ultraviolet region of the spectrum, such as a light-emitting diode and a semiconductor laser; and a method for producing the same.

2. Description of the Related Art

FIG. 19 is a cross-sectional view showing the structure of the gallium nitride group compound semiconductor laser disclosed in Japanese Laid-Open Publication No. 8-97507. The gallium nitride group compound semiconductor laser is fabricated by a metal organic chemical vapor deposition method (an MOCVD method). Hereinafter, the structure of the gallium nitride group compound semiconductor laser and a method for fabricating the same will be described.

First of all, a sapphire substrate 101 is inserted into an MOCVD apparatus. Then, an N-type GaN buffer layer 102, an N-type AlGaN lower cladding layer 103, an InGaN active layer 104, a P-type AlGaN upper cladding layer 105 and an N-type AlGaN internal current constricting layer 107 are sequentially grown on the sapphire substrate 101 in this order.

Next, the sapphire substrate 101 having the above-described layers provided thereon, namely a wafer, is taken out from the MOCVD apparatus. Then, the N-type AlGaN internal current constricting layer 107 is etched by photolithography to form a stripe-shaped opening. As a result, a current constricting layer with an opening is formed.

Thereafter, the above-described wafer is again inserted into the MOCVD apparatus. Then, a regrowth step is performed, and a P-type AlGaN upper cladding layer 108 and a P-type GaN contact layer 109 are sequentially formed in this order on the N-type AlGaN internal current constricting layer 107.

Finally, a P-side electrode 110 and an N-side electrode 111 are formed. In the above-described manner, the gallium nitride group compound semiconductor laser having the structure shown in FIG. 19 is completed.

According to this type of gallium nitride group compound semiconductor laser, in the case where the internal current constricting layer 107 is etched using wet etching or dry etching to form a stripe-shaped opening until a surface of the P-type AlGaN upper cladding layer 105 is exposed and then the P-type AlGaN upper cladding layer 108 is regrown in the MOCVD apparatus so as to cover the exposed surface of the P-type AlGaN upper cladding layer 105 and surfaces of the N-type AlGaN internal current constricting layer 107, the substrate temperature needs to be raised to about 1050° C. (A substrate temperature means a temperature of a substrate having layers provided thereon.)

As a result, during a rise in the substrate temperature, an increase in surface roughness at the exposed surface of the P-type AlGaN upper cladding layer 105; a change in the width of the striped-shaped opening; and a deformation of the stripe-shaped opening formed in the N-type AlGaN internal current constricting layer 107 are generated. Consequently, electrical characteristics of the gallium nitride group compound semiconductor laser are deteriorated due to high resistance at the regrowth interface, and optical characteristics are deteriorated due to the change in the width of the stripe-shaped opening and the deformation of the stripe-shaped opening. Thus, the above-described gallium nitride group compound semiconductor laser has problems of reduced device characteristics.

The above-described problems will be described in detail with reference to FIG. 20. Since the step of regrowing the regrowth P-type AlGaN upper cladding layer 108 on the exposed surface of the AlGaN upper cladding layer 105 (the surface is exposed by etching) is performed at a high temperature of about 1050° C., as shown in FIG. 20, a P-type impurity escapes by evaporation in the gas phase from the exposed surface of the P-type AlGaN upper cladding layer 105. As a result, a defect is caused on the exposed surface of the P-type AlGaN upper cladding layer 105 and surface roughness is increased at the exposed surface of the upper cladding layer 105. Accompanying this phenomenon, the stripe-shaped opening in the current constricting layer 107 is deformed. Moreover, Si (an N-type impurity) evaporates in the gas phase from the current constricting layer 107. As a result, surface roughness is increased at the surface of the current constricting layer 107. Consequently, crystallinity of the regrowth P-type AlGaN upper cladding layer 108, which is grown on the current constricting layer 107, is deteriorated. Thus, the surface condition of the regrowth P-type AlGaN upper cladding layer 108 is deteriorated.

When impurities escape from the interface between layers, resistance becomes high at the interface, thereby deteriorating the electrical characteristics. More specifically, forward voltage, operating voltage, and threshold voltage are increased. As a result, a light emitting pattern cannot be stabilized.

According to the above-described gallium nitride group compound semiconductor laser, the optical characteristics are deteriorated due to a change in the width of the stripe-shaped opening and deformation of the stripe-shaped opening. As a result, crystallinity of the regrowth P-type AlGaN upper cladding layer 108 is deteriorated, thereby causing the deteriorated surface condition of the regrowth upper cladding layer 108. Thus, reliability of the semiconductor laser is reduced.

According to the above-described conventional gallium nitride group compound semiconductor laser, the regrowth P-type AlGaN upper cladding layer 108 is grown directly on the exposed surface of the P-type AlGaN upper cladding layer 105 and the surfaces of the current constricting layer 107 at a high temperature. Therefore, due to damage caused by heat, the electrical and optical characteristics of the semiconductor laser are deteriorated, thereby reducing its reliability.

At present, however, no suitable wet etching solution for etching a gallium nitride group compound semiconductor is known. Therefore, in the step of removing the growth layer of the gallium nitride group compound semiconductor, it is difficult to leave the layer so as to have a required thickness, and good reproducibility, and to expose the surface of the desired growth layer by using a wet etching solution.

Also, when an internal current constricting layer is etched by photolithography in an ambient atmosphere to form a stripe-shaped opening and thus forming a current constricting layer with an opening, an impurity such as C or O attaches to the exposed surface of the upper cladding layer 105. As a result, when the regrowth upper cladding layer 108 is grown on the exposed surface of the upper cladding layer 105, interface level is generated at the regrowth interface.

Consequently, series resistance at the interface and forward voltage increase. Thus, electrical characteristics are further deteriorated.

A gallium nitride group compound light-emitting diode having a current blocking layer instead of the current constricting layer has the same problems as those described above.

SUMMARY OF THE INVENTION

According to one aspect of this invention, a gallium nitride group compound semiconductor light-emitting device comprises a substrate and a layered structure provided on the substrate. The layered structure includes: an active layer; an upper cladding layer and a lower cladding layer which is located closer to the substrate than the upper cladding layer, the active layer interposed between the cladding layers; an internal current constricting layer having an opening for constricting a current within a selected region of the active layer, the internal current constricting layer being provided on the upper cladding layer; a surface protecting layer for covering the internal current constricting layer and an exposed surface of the upper cladding layer in the opening of the internal current constricting layer; and a regrowth layer provided on the surface protecting layer. The surface protecting layer serves as a protecting layer for the upper cladding layer and the internal current constricting layer in a step of forming the regrowth layer.

In one embodiment of the present invention, a high impurity concentration region is provided near the exposed surface of the upper cladding layer in the opening.

In another embodiment of the present invention, a re-evaporation layer having an opening in a region corresponding to the opening of the internal current constricting layer is provided between the upper cladding layer and the internal current constricting layer.

In still another embodiment of the present invention, the substrate is non-conductive; the lower cladding layer and the internal current constricting layer are of a first conductivity type; the upper cladding layer and the surface protecting layer are of a second conductivity type; a buffer layer of the first conductivity type is provided between the substrate and the lower cladding layer; the regrowth layer includes a regrowth cladding layer of the second conductivity type; and a contact layer of the second conductive type is provided on the regrowth cladding layer.

In still yet another embodiment of the present invention, the substrate is non-conductive; the lower cladding layer and the internal current constricting layer are of a first conductivity type; the upper cladding layer, the high impurity concentration region, the re-evaporation layer, and the surface protecting layer are of a second conductivity type; a buffer layer of the first conductivity type is provided between the substrate and the lower cladding layer; the regrowth layer includes a regrowth cladding layer of the second conductivity type; and a contact layer of the second conductivity type is provided on the regrowth cladding layer.

In still yet another embodiment of the present invention, the substrate, the lower cladding layer, and the internal current constricting layer are of a first conductivity type; the upper cladding layer and the surface protecting layer are of a second conductivity type; a buffer layer of the first conductivity type is provided between the substrate and the lower cladding layer; the regrowth layer includes a regrowth cladding layer of the second conductivity type; and a contact layer of the second conductivity type is provided on the regrowth cladding layer.

In still yet another embodiment of the present invention, the substrate, the lower cladding layer, and the internal current constricting layer are of a first conductivity type; the upper cladding layer, the high impurity concentration region, the re-evaporation layer, and the surface protecting layer are of a second conductivity type; a buffer layer of the first conductivity type is provided between the substrate and the lower cladding layer; the regrowth layer includes a regrowth cladding layer of the second conductivity type; and a contact layer of the second conductivity type is provided on the regrowth cladding layer.

In still yet another embodiment of the present invention, the surface protecting layer is made of $Al_tGa_{1-t}N$ ($0<t<1$); the internal current constricting layer is made of $Al_wGa_{1-w}N$ ($0 \leq w \leq 1$); the lower cladding layer and the upper cladding layer are made of $Al_xGa_{1-x}N$ ($0 \leq x < 1$); and the active layer is made of $In_yGa_{1-y}N$ ($0 \leq y \leq 1$: when $w=0$, $y \neq 0$).

In still yet another embodiment of the present invention, the surface protecting layer is made of $Al_tGa_{1-t}N$ ($0<t<0.5$).

In still yet another embodiment of the present invention, the surface protecting layer is made of $Al_tGa_{1-t}N$ ($0.05<t<0.2$).

In still yet another embodiment of the present invention, the surface protecting layer is made of $Al_tGa_{1-t}N$ ($0<t<1$); the re-evaporation layer is made of $In_zGa_{1-z}N$ ($0<z \leq 1$); the internal current constricting layer is made of $Al_wGa_{1-w}N$ ($0 \leq w \leq 1$); the lower cladding layer and the upper cladding layer are made of $Al_xGa_{1-x}N$ ($0 \leq x < 1$); and the active layer is made of $In_yGa_{1-y}N$ ($0 \leq y \leq 1$: when $x=0$, $y \neq 0$).

In still yet another embodiment of the present invention, the first conductivity type is an N-type; the second conductivity type is a P-type; and an impurity ion of the second conductivity type in the high impurity concentration region is selected from the group consisting of Mg and Zn.

In still yet another embodiment of the present invention, the first conductivity type is a P-type; the second conductivity type is an N-type; and an impurity ion of the second conductivity type in the high impurity concentration region is selected from the group consisting of Si, S, Se, Ge, Sn, and Te.

In still yet another embodiment of the present invention, the surface protecting layer serves to prevent impurity from evaporating in the gas phase from the upper cladding layer and also serves to prevent a surface roughness of the upper cladding layer and a deformation of the opening of the internal current constricting layer.

In still yet another embodiment of the present invention, the surface protecting layer serves as an evaporation preventing layer for preventing impurity from evaporating in the gas phase from the high impurity concentration region and the upper cladding layer.

In still yet another embodiment of the present invention, the surface protecting layer is formed at a temperature of about 400 to about 650° C. wherein no deterioration in a decomposition efficiency of material gases is caused and evaporation of the internal current constricting layer and the upper cladding layer is prevented.

In still yet another embodiment of the present invention, a current blocking layer is provided instead of the internal current constricting layer.

According to another aspect of this invention, there is a method for fabricating a gallium nitride group compound semiconductor light-emitting device. The gallium nitride group compound semiconductor light-emitting device comprises a substrate and a layered structure provided on the substrate. The layered structure includes: an active layer; an upper cladding layer and a lower cladding layer which is closer to the substrate than the upper cladding layer, the active layer interposed between the cladding layers; an internal current constricting layer having an opening for constricting a current within a selected region of the active layer, the internal current constricting layer being provided on the upper cladding layer; a surface protecting layer for covering the internal current constricting layer and an exposed surface of the upper cladding layer in the opening of the internal current constricting layer; and a regrowth layer provided on the surface protecting layer. The method includes the steps of: forming the surface protecting layer at a temperature in a first temperature range so as to cover the internal current constricting layer and the exposed surface of the upper cladding layer in the opening of the internal current constricting layer; and forming the regrowth layer on the surface protecting layer at a temperature in a second temperature range. The first temperature range is lower than the second temperature range.

In one embodiment of the present invention, the first temperature range is a range in which no deterioration in a decomposition efficiency of material gases is caused and also evaporation of the internal current constricting layer and the upper cladding layer is prevented.

In another embodiment of the present invention, the first temperature range is about 400 to about 650° C.

In still another embodiment of the present invention, the steps of: inserting the substrate in a growth chamber, and growing a buffer layer on the substrate using $Al_uGa_{1-u}N$ ($0 \leq u \leq 1$) of a first conductivity type; growing the lower cladding layer on the $Al_uGa_{1-u}N$ buffer layer of the first conductivity type using $Al_xGa_{1-x}N$ ($0 \leq x < 1$) of the first conductivity type; growing the active layer on the $Al_xGa_{1-x}N$ lower cladding layer of the first conductivity type using $In_yGa_{1-y}N$ ($0 \leq y \leq 1$: when $x=0$, $y \neq 0$); growing the upper cladding layer on the $In_yGa_{1-y}N$ active layer using $Al_xGa_{1-x}N$ ($0 \leq x < 1$) of a second conductivity type; growing the internal current constricting layer on the $Al_xGa_{1-x}N$ upper cladding layer of the second conductivity type using $Al_wGa_{1-w}N$ ($0 \leq w \leq 1$) of the first conductivity type; removing the substrate from the growth chamber, and selectively removing a part of the $Al_wGa_{1-w}N$ internal current constricting layer of the first conductivity type so as to form an opening; inserting the substrate again into the growth chamber, and growing the surface protecting layer on the $Al_wGa_{1-w}N$ internal current constricting layer of the first conductivity type using $Al_tGa_{1-t}N$ ($0 < t < 1$) of the second conductivity type; and growing the regrowth layer including the regrowth cladding layer on the $Al_tGa_{1-t}N$ surface protecting layer of the second conductivity type using $Al_xGa_{1-x}N$ ($0 \leq x < 1$) of the second conductivity type, and sequentially growing a contact layer thereon using $Al_{x'}Ga_{1-x'}N$ ($0 \leq x' < 1$) of the second conductivity type, are further included.

In still yet another embodiment of the present invention, the steps of: forming a re-evaporation layer between the $Al_xGa_{1-x}N$ upper cladding layer of the second conductivity type and the $Al_wGa_{1-w}N$ internal current constricting layer of the first conductivity type using $In_zGa_{1-z}N$ ($0 < z \leq 1$) of the second conductivity type; evaporating an exposed portion of the $In_zGa_{1-z}N$ re-evaporation layer in the opening of the $Al_wGa_{1-w}N$ internal current constricting layer so as to expose a surface of the $Al_xGa_{1-x}N$ upper cladding layer; and depositing a metallic element as an impurity of the second conductivity type in the vicinity of the exposed surface of the $Al_xGa_{1-x}N$ upper cladding layer or injecting ions thereto so as to form a high impurity concentration region including the impurity of the second conductivity type at a high concentration near the exposed surface of the $Al_xGa_{1-x}N$ upper cladding layer, are further included.

In still yet another embodiment of the present invention, the substrate is non-conductive; the first conductivity type is an N-type; and the second conductivity type is a P-type.

In still yet another embodiment of the present invention, the substrate is non-conductive; the first conductivity type is an N-type; and the second conductivity type is a P-type.

In still yet another embodiment of the present invention, the substrate is non-conductive; the first conductivity type is a P-type; and the second conductivity type is an N-type.

In still yet another embodiment of the present invention, the substrate is non-conductive; the first conductivity type is a P-type; and the second conductivity type is an N-type.

In still yet another embodiment of the present invention, the substrate is conductive; the first conductivity type is an N-type; and the second conductivity type is a P-type.

In still yet another embodiment of the present invention, the substrate is conductive; the first conductivity type is an N-type; and the second conductivity type is a P-type.

In still yet another embodiment of the present invention, the substrate is conductive; the first conductivity type is a P-type; and the second conductivity type is an N-type.

In still yet another embodiment of the present invention, the substrate is conductive; the first conductivity type is a P-type; and the second conductivity type is an N-type.

In still yet another embodiment of the present invention, the surface protecting layer serves to prevent impurity from evaporating in the gas phase from the upper cladding layer and also prevent a surface roughness of the upper cladding layer and a deformation of the opening of the internal current constricting layer.

In still yet another embodiment of the present invention, the surface protecting layer serves as an evaporation preventing layer for preventing impurity from evaporating in the gas phase from the high impurity concentration region and the upper cladding layer.

In still yet another embodiment of the present invention, the steps of: forming a current blocking layer instead of the internal current constricting layer; and taking the substrate out from the growth chamber, and selectively removing the current blocking layer so as to expose a part of a surface of the upper cladding layer, are further included.

According to the structure having a surface protecting layer formed at a temperature in a range in which no deterioration in the decomposition efficiency of material gases is caused and also evaporation of the internal current constricting layer and the underlying cladding layer is prevented, impurities can be prevented from escaping from the underlying cladding layer, thereby causing no high resistance at the interface. As a result, forward voltage can be reduced, thereby improving the electrical characteristics.

In addition, according to such a structure, an increase in surface roughness of the underlying cladding layer or the like can be prevented. Since the underlying cladding layer can be protected by the surface protecting layer, crystallinity of the regrowth cladding layer becomes satisfactory, thereby making the surface condition of the regrowth cladding layer satisfactory.

Moreover, according to such a structure, a deformation of the stripe-shaped opening and a change in the width of the stripe-shaped opening can be prevented.

Thus, the optical characteristics can be improved.

Due to the reasons described above, the gallium nitride group compound semiconductor light-emitting device having the above-described structure can improve the electrical and optical characteristics (for example, a reduction in the operating voltage, stabilization of the light emitting pattern, a reduction in the threshold current, and the like) and also improve its reliability.

Furthermore, since the underlaying cladding layer is protected from heat by the surface protecting layer, the composition ratio can be stabilized. Therefore, reliability can be further improved.

The surface protecting layer should be grown at a temperature in a range in which no deterioration in the decomposition efficiency of material gases is caused and also evaporation of the internal current constricting layer and the underlying cladding layer is prevented. More specifically, the temperature range is about 400 to about 800° C. However, since a controlling margin is required when the surface protecting layer is actually grown, the range of about 400 to about 650° C. is more preferable.

When the $Al_yGa_{1-y}N$ upper cladding layer and the $Al_yGa_{1-y}N$ regrowth cladding layer are of N-type, composition ratio of Al, i.e., the value of y, can be larger than that of P-type (provided that the condition of $x \neq y$ is satisfied with respect to the $Al_xGa_{1-x}N$ cladding layer). Thus, according to the present invention, light confinement ability can be further improved.

The above-described method can be applied to a gallium nitride group compound semiconductor light-emitting device having a current blocking layer on the cladding layer instead of the current constricting layer.

According to the structure in which the high impurity concentration region is formed near the surface of the underlying cladding layer and the evaporation preventing layer is formed so as to cover the internal current constricting layer, an impurity can be prevented from evaporating in the gas phase from the high impurity concentration region. As a result, series resistance at the regrowth interface can be reduced. Consequently, even when the wafer is etched by photolithography in an ambient atmosphere to form the stripe-shaped opening and thus form the current constricting layer with the stripe-shaped opening, interface level is generated at the regrowth interface. As a result, series resistance at the regrowth interface is not increased.

Therefore, a highly-reliable gallium nitride group compound semiconductor light-emitting device having a low forward voltage (thus satisfactory electrical characteristics), and satisfactory regrowth interface can be realized.

In the above-described structures, the surface protecting layer (or the evaporation preventing layer) laminated at a low substrate temperature (i.e., a temperature lower than growth temperature) both are polycrystals. However, during the step of raising the substrate temperature to cause the regrowth of the regrowth cladding layer on the surface of the surface protecting layer or the evaporation preventing layer, the surface protecting layer or the evaporation preventing layer transforms from the polycrystalline state to the single crystalline state. Thus, there are no significant adverse effects on the device characteristics.

Thus, the invention described herein makes possible the advantage of providing a gallium nitride group compound semiconductor light-emitting device which has a high-quality regrowth interface and can improve electrical and optical characteristics, reliability and device characteristics; and a method for producing the same.

This and other advantages of the present invention will become apparent to those skilled in the art upon reading and understanding the following detailed description with reference to the accompanying figures.

BRIEF DESCRIPTION OF THE DRAWINGS

FIGS. 8A to 8G show production steps of the gallium nitride group compound semiconductor laser in FIG. 7 according to Example 4 of the present invention;

FIGS. 10A to 10K show production steps of the gallium nitride group compound semiconductor laser in FIG. 9 according to Example 5 of the present invention;

FIGS. 14A to 14K show production steps of the gallium nitride group compound semiconductor laser in FIG. 13 according to Example 7 of the present invention;

FIGS. 16A to 16K show production steps of the gallium nitride group compound semiconductor laser in FIG. 15 according to Example 8 of the present invention;

FIG. 20 is a schematic cross-sectional view for illustrating problems of the conventional gallium nitride group semiconductor laser.

DESCRIPTION OF THE PREFERRED EMBODIMENTS

Hereinafter, the present invention will be described by way of illustrative, but non-limiting examples with reference to the accompanying drawings. In this specification, a gallium nitride group compound semiconductor includes, for example, $Ga_cAl_dIn_{1-c-d}N$ ($0<c\leq 1$, $0\leq d<1$, $0<c+d\leq 1$).

EXAMPLE 1

Figure 1:
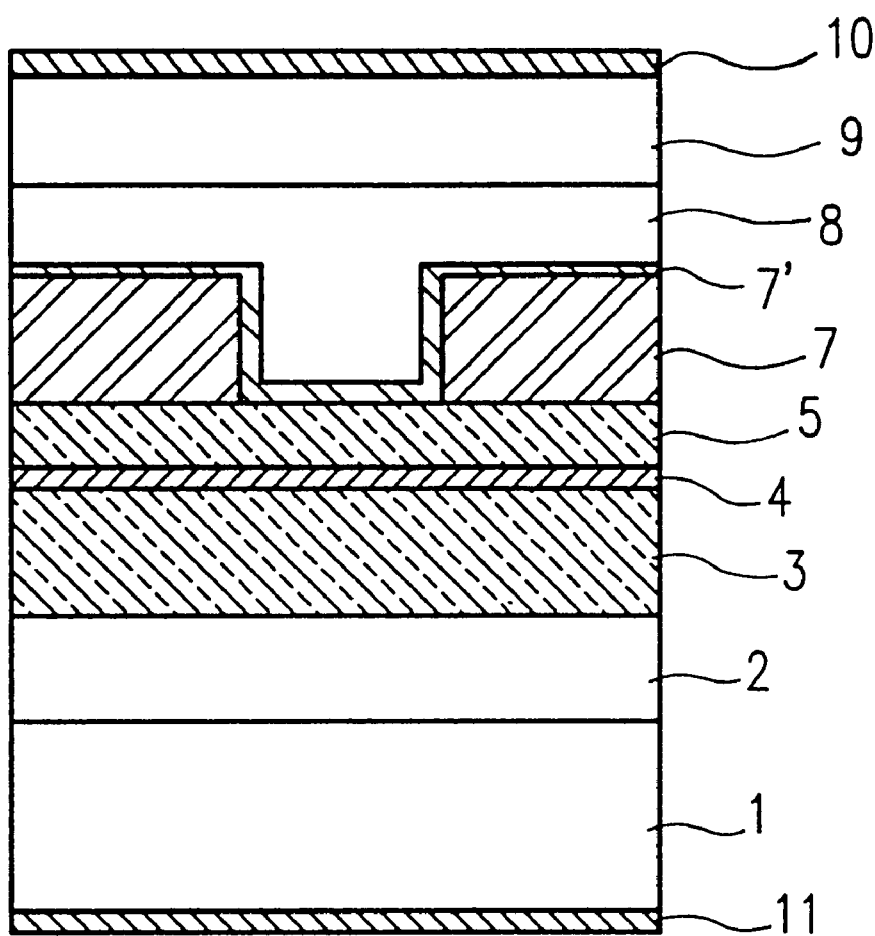
FIG. 1 is a schematic cross-sectional view showing a gallium nitride group compound semiconductor laser according to Example 1 of the present invention.

FIG. 1 shows a gallium nitride group compound semiconductor light-emitting device according to Example 1 of the present invention. In Example 1, the present invention is applied to a gallium nitride group compound semiconductor laser.

The gallium nitride group compound semiconductor laser is fabricated using a MOCVD method. As a substrate to be inserted into a MOCVD apparatus, a SiC substrate having low resistance is employed. As a group V material, ammonia ($NH_3$) is used, and as group III materials, trimethyl gallium (TMG), trimethyl aluminum (TMAl) and trimethyl indium (TMIn) are used. As a P-type impurity and an N-type impurity, biscyclopentadienylmagnesium ($Cp_2Mg$) and monosilane ($SiH_4$) are employed respectively. $H_2$ and $N_2$ are used as carrier gases.

As shown in FIG. 1, the gallium nitride group compound semiconductor laser includes an N-type GaN buffer layer 2, an N-type $Al_{0.1}Ga_{0.9}N$ cladding layer 3 (a lower cladding layer), an non-doped $In_{0.15}Ga_{0.85}N$ active layer 4, a Mg-doped $Al_{0.1}Ga_{0.9}N$ cladding layer 5 (an upper cladding layer), an N-type $Al_{0.05}Ga_{0.95}N$ internal current constricting layer 7, an Mg-doped $Al_{0.1}Ga_{0.9}N$ cladding layer 8, and a Mg-doped GaN contact layer 9 sequentially provided on a low resistance N-type SiC substrate 1 in this order. An N-side electrode 11 is provided on a bottom surface of the low resistance N-type SiC substrate 1. A P-side electrode 10 is provided on a top surface of the Mg-doped GaN contact layer 9. A surface protecting layer 7' is provided so as to cover the upper and side surfaces of N-type $Al_{0.05}Ga_{0.95}N$ internal current constricting layer 7 and the exposed surface of the Mg-doped $Al_{0.1}Ga_{0.9}N$ cladding layer 5.

Figure 2A:
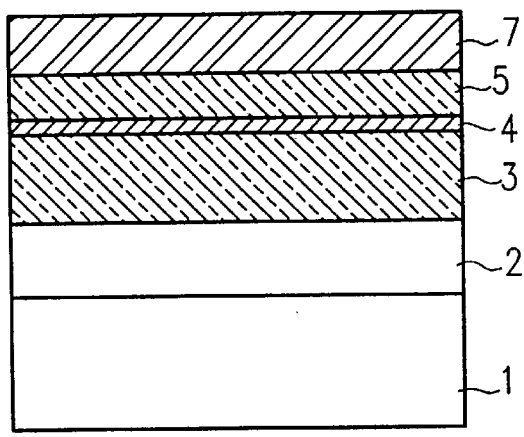
FIGS. 2A to 2G show production steps of the gallium nitride group compound semiconductor laser in FIG. 1 according to Example 1 of the present invention.

Hereinafter, the production steps of the gallium nitride group compound semiconductor laser in Example 1 will be described with reference to FIGS. 2A through 2G. First, in order to perform a first crystal growth, the low resistance N-type SiC substrate 1 is placed on a susceptor of the MOCVD apparatus. Next, the temperature of the substrate 1 is raised to about 1200° C. and surface treatment is conducted. Then, the temperature of the low resistance N-type SiC substrate 1 is lowered to about 1050° C. Thereafter, as shown in FIG. 2A, the N-type GaN buffer layer 2 is grown on the low resistance N-type SiC substrate 1 so as to have a thickness of about 0.05 to about 1 µm.

Next, the N-type $Al_{0.01}Ga_{0.9}N$ cladding layer 3 is grown on the N-type GaN buffer layer 2 so as to have a thickness of about 0.7 to about 1 µm. Thereafter, the substrate temperature is lowered to be a temperature between about 800 and about 850° C. Then, an non-doped $In_{0.15}Ga_{0.85}N$ active layer 4 is grown on the N-type $Al_{0.1}Ga_{0.9}N$ cladding layer 3 so as to have a thickness of about 3 to about 80 nm.

Thereafter, the substrate temperature is raised to about 1050° C., and the Mg-doped $Al_{0.1}Ga_{0.9}N$ cladding layer 5 is grown on the non-doped $In_{0.15}Ga_{0.85}N$ active layer 4 so as to have a thickness of about 0.1 to 0.3 µm. Then, the N-type $Al_{0.05}Ga_{0.95}N$ internal current constricting layer 7 is grown on the Mg-doped $Al_{0.1}Ga_{0.9}N$ cladding layer 5 so as to have a thickness of about 0.5 µm.

Figure 2B:
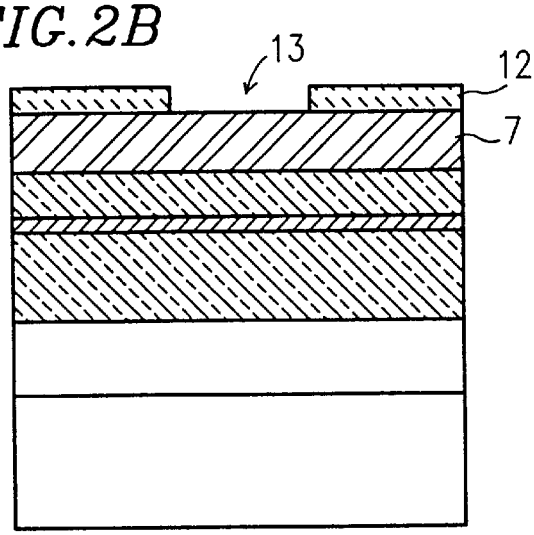

Then, the low resistance N-type SiC substrate 1 having the above-described layers provided thereon, namely a wafer, is taken out from a growth chamber in the MOCVD apparatus. In the ambient atmosphere, an $SiO_X$ film, an $SiN_X$ film or a resist mask 12 is formed on the upper surface of the N-type $Al_{0.05}Ga_{0.95}N$ internal current constricting layer 7. Thereafter, as shown in FIG. 2B, a part of the $SiO_X$ film, $SiN_X$ film, or resist mask 12 is removed so as to form a stripe-shaped opening 13.

Figure 2C:
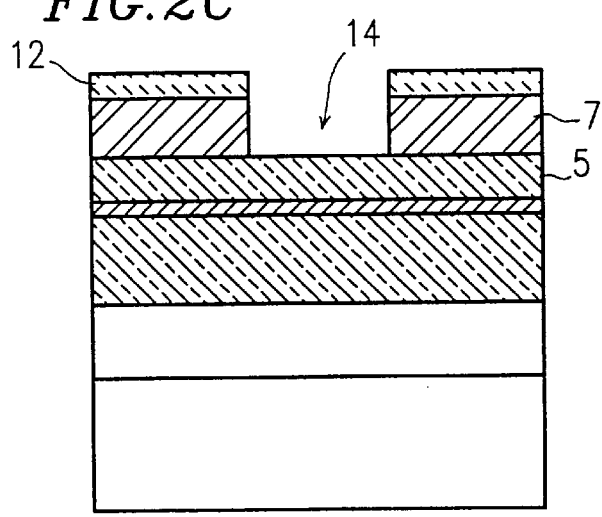

Next, the wafer is treated with wet etching or dry etching. As shown in FIG. 2C, the N-type $Al_{0.05}Ga_{0.95}N$ internal current constricting layer 7 is etched to form a deeper opening 14 until the surface of the Mg-doped $Al_{0.1}Ga_{0.9}N$ cladding layer 5 is exposed. The etching is performed by using, for example, an RIE (reactive ion etching) method or an ECR-RIBE (Electron Cyclotron Resonance-Reactive Ion Beam Etching) method.

Figure 2D:
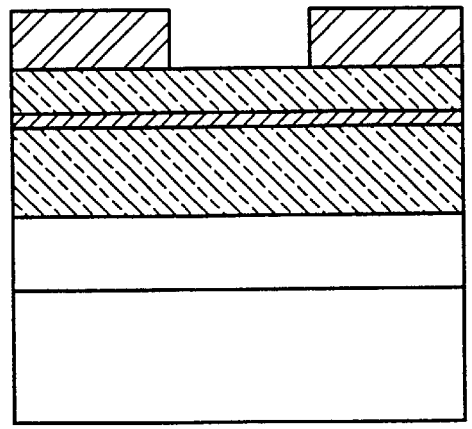
Figure 2E:
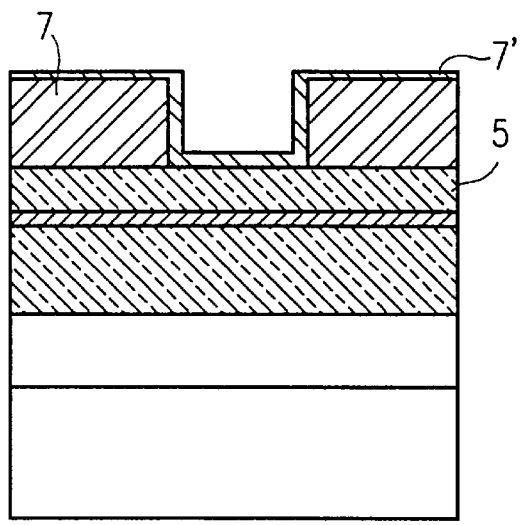

Subsequently, as shown in FIG. 2D, the resist mask 12 is removed by a hydrofluoric acid group etching solution or an organic solvent.

Then, the wafer is again placed on the susceptor of the MOCVD apparatus. The present invention differs from the above-described conventional method on the following point. Specifically, before proceeding to the step of raising the substrate temperature to about 1050° C. so as to grow a regrowth cladding layer, i.e., the Mg-doped $Al_{0.1}Ga_{0.9}N$ cladding layer 8, the Mg-doped $Al_{0.05}Ga_{0.95}N$ surface protecting layer 7' (see FIG. 2E) which contains Al and has a thickness of about 10 to about 20 nm is grown at a substrate temperature of about 400 to about 650° C. so as to cover the exposed surface of the cladding layer 5 and the surfaces of the internal current constricting layer 7.

At this point, the surface protecting layer 7' grown at a low substrate temperature (about 400 to about 650° C.) is in a polycrystalline state. However, during the step of raising the substrate temperature to cause regrowth of the cladding layer 8 on the surface of the surface protecting layer 7', the surface protecting layer 7' transforms from the polycrystalline state to the single crystalline state. Thus, there are no significant adverse effects on the device characteristics.

The growth temperature of the surface protecting layer 7' should be in a range in which no deterioration in the decomposition efficiency of material gases is caused and also evaporation of the N-type $Al_{0.05}Ga_{0.95}N$ internal current constricting layer 7 and the Mg-doped $Al_{0.1}Ga_{0.9}N$ cladding layer 5 is prevented. More specifically, the growth temperature should be in the range of about 400° C. to about 800° C. However, since a controlling margin is required when the surface protecting layer 7' is actually grown, the range of about 400° C. to about 650° C. is more preferable.

Figure 2F:
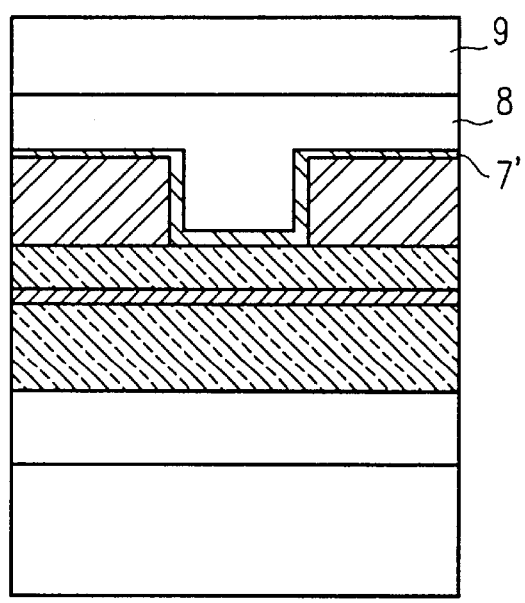

Next, as shown in FIG. 2F, the substrate temperature is raised to about 1050° C. so that the Mg-doped $Al_{0.1}Ga_{0.9}N$ cladding layer 8 is grown to have a thickness of about 0.7 to about 1 µm and the Mg-doped GaN contact layer 9 is grown to have a thickness of about 0.5 to about 1 µm.

Figure 2G:
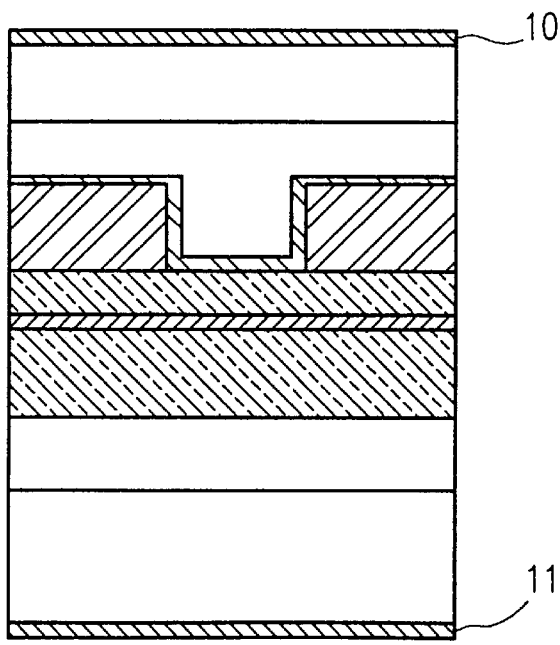

Thereaft2r, the wafer is taken out from the MOCVD apparatus. In an $N_2$ atmosphere, the wafer is annealed at a temperature of about 800° C. so that the Mg-doped layers are transformed to be P-type. Then, as shown in FIG. 2G, the P-side electrode 10 is formed on the P-type GaN contact layer 9, and the N-side electrode 11 is formed on the low resistance N-type SiC substrate 1.

In the above-described manner, the gallium nitride group compound semiconductor laser having the structure shown in FIG. 1 is completed.

According to the gallium nitride group compound semiconductor laser in Example 1, the Mg-doped $Al_{0.05}Ga_{0.95}N$ surface protecting layer 7' is formed so as to cover the exposed surface of the cladding layer 5 and the surfaces of the internal current constricting layer 7. As described above, such a structure prevents the following from occurring during a rise in the substrate temperature: (1) increase in surface roughness of the exposed surface of the cladding layer 5; (2) a change in the width of the stripe-shaped opening; and (3) deformation of the stripe-shaped opening formed in the internal current constricting layer 7.

Thus, according to Example 1 of the present invention, a highly-reliable gallium nitride group compound semiconductor laser having excellent electrical and optical characteristics can be realized.

The thickness of the Mg-doped $Al_{0.05}Ga_{0.95}N$ surface protecting layer 7' is in the range of about 10 nm to about 1 $\mu$m, and preferably in the range of about 10 nm to about 60 nm. In the case where the thickness of the surface protecting layer 7' is less than 10 nm, the surface protecting layer 7' is evaporated during the rise in the substrate temperature, thereby no longer functioning as a protecting layer. In the case where the thickness of the surface protecting layer 7' exceeds 1 $\mu$m, crystallinity and the surface condition deteriorate, thereby having an adverse effect on layers to be formed thereon.

Regarding a composition ratio of the Mg-doped $Al_{0.05}Ga_{0.95}N$ surface protecting layer 7', i.e., $Al_xGa_{1-x}N$, x is in the range of about 0<x<0.5 and preferably in the range of about 0.05<x<0.2. In the case where x=0 (i.e., in the case where the surface protecting layer 7' is formed of a GaN layer), the surface protecting layer 7' is evaporated, thereby no longer functioning as a protecting layer. In the case where x is 0.5 or more, resistance becomes high even when an impurity is doped, and crystallinity is deteriorated.

The composition ratio of the Mg-doped $Al_{0.05}Ga_{0.95}N$ surface protecting layer 7' and the composition ratio of the Mg-doped $Al_{0.1}Ga_{0.9}N$ cladding layer 5 have the following relationship. In the case where the $Al_yGa_{1-y}N$ cladding layer 5 is a GaN cladding layer 5 (y=0), the layer has a low light confinement ability. However, if the value of x in the $Al_xGa_{1-x}N$ surface protecting layer 7' is increased, sufficient level of light confinement can be achieved. Therefore, it is required to set composition ratios of the two layers 7' and 5 in consideration of the relationship between the composition ratios.

EXAMPLE 2

Figure 3:
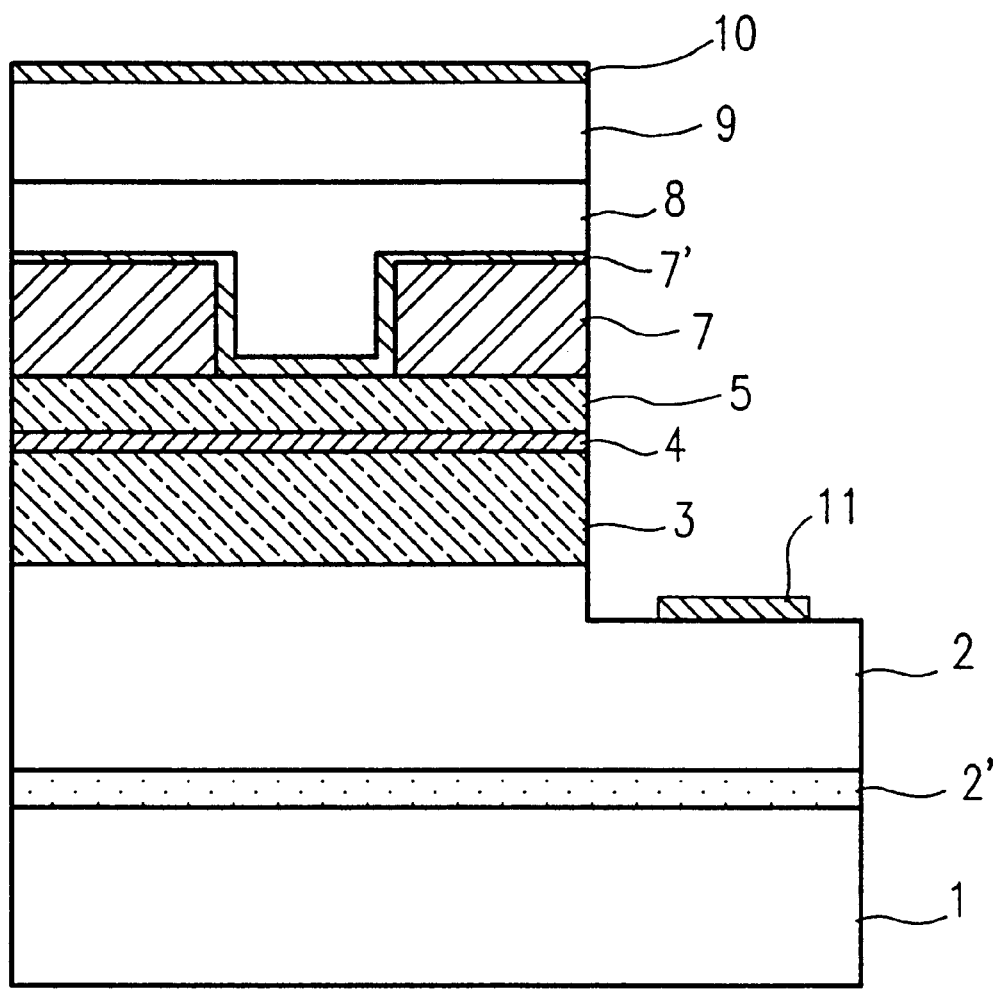
FIG. 3 is a schematic cross-sectional view showing a gallium nitride group compound semiconductor laser according to Example 2 of the present invention.

FIG. 3 shows a gallium nitride group compound semiconductor light-emitting device according to Example 2 of the present invention. The gallium nitride group compound semiconductor laser in Example 2 employs a sapphire substrate. Regarding a group V material, group III materials, a P-type impurity, an N-type impurity and carrier gases, the same materials as those in Example 1 are used in Example 2. The same components are denoted by the same reference numerals as those in Example 1 even if their materials and composition ratios are different. Regarding this point, the same thing applies to the following Examples.

The gallium nitride group compound semiconductor laser of Example 2 differs from that of Example 1 mainly in the following points. As shown in FIG. 3, in the gallium nitride group compound semiconductor laser of Example 2, a GaN buffer layer, an AlN buffer layer or an $Al_{0.01}Ga_{0.9}N$ buffer layer 2' is formed on a top surface of a sapphire substrate 1, and an N-side electrode 11 is formed on an exposed surface of an N-type GaN buffer layer 2.

Hereinafter, the production steps of the gallium nitride group compound semiconductor laser according to Example 2 of the present invention are described with reference to FIGS. 4A to 4G.

Figure 4A:
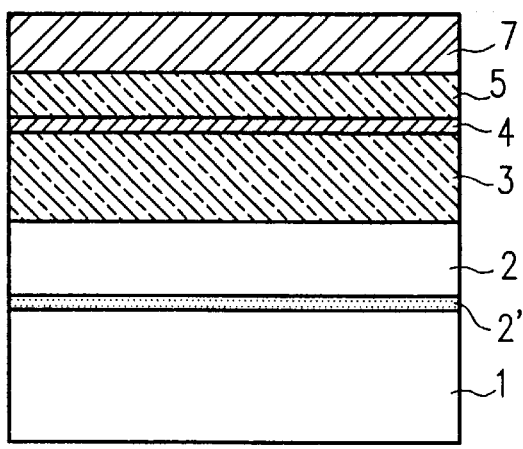
FIGS. 4A to 4G show production steps of the gallium nitride group compound semiconductor laser in FIG. 3 according to Example 2 of the present invention.

First of all, in order to perform a first crystal growth, the sapphire substrate 1 is placed on the susceptor of the MOCVD apparatus. Next, the substrate temperature is raised to about 1200° C., and surface treatment is conducted. Then, the temperature of the sapphire substrate 1 is lowered to be a temperature between about 500° C. and about 650° C. Thereafter, as shown in FIG. 4A, the GaN buffer layer, the AlN buffer layer or the $Al_{0.1}Ga_{0.9}N$ buffer layer 2' is grown on the top surface of the sapphire substrate 1 so as to have a thickness of about 50 nm to about 2 $\mu$m. Then, the substrate temperature is raised to about 1050° C., and the N-type GaN buffer layer 2 is grown so as to have a thickness of about 0.5 to about 1 $\mu$m.

Next, an N-type $Al_{0.1}Ga_{0.9}N$ cladding layer 3 is grown on the N-type GaN buffer layer 2 so as to have a thickness of about 0.7 to about 1 $\mu$m. Then, the substrate temperature is lowered to be a temperature between about 800° C. and about 850° C., and an non-doped $In_{0.15}Ga_{0.85}N$ active layer 4 with a thickness of about 3 to about 80 nm is grown on the N-type $Al_{0.1}Ga_{0.9}N$ cladding layer 3.

Thereafter, the substrate temperature is raised to about 1050° C. Then, an Mg-doped $Al_{0.1}Ga_{0.9}N$ cladding layer 5 with a thickness of about 0.1 to about 0.3 $\mu$m is grown on the non-doped $In_{0.15}Ga_{0.85}N$ active layer 4, and an N-type $Al_{0.05}Ga_{0.95}N$ internal current constricting layer 7 with a thickness of about 0.5 $\mu$m is grown on the Mg-doped $Al_{0.1}Ga_{0.9}N$ cladding layer 5.

Figure 4B:
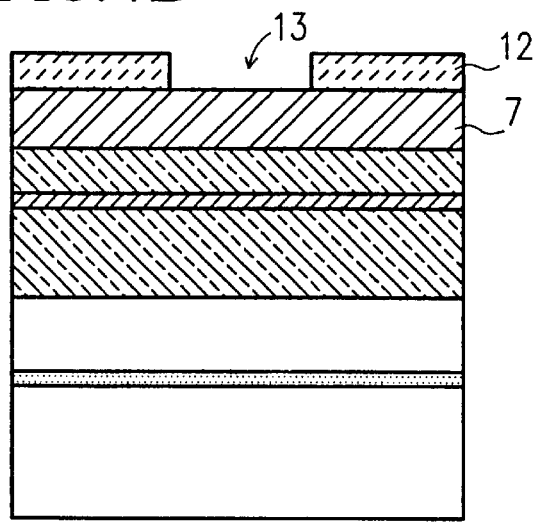

Next, the wafer is taken out from the growth chamber in the MOCVD apparatus. An $SiO_X$ film, an $SiN_X$ film or a resist mask 12 is formed on the N-type $Al_{0.05}Ga_{0.95}N$ internal current constricting layer 7. Then, as shown in FIG. 4B, a part of the $SiO_X$ film, the $SiN_X$ film or the resist mask 12 on the N-type $Al_{0.05}Ga_{0.95}N$ internal current constricting layer 7 is removed using a common photolithography technique so as to form a stripe-shaped opening 13.

Figure 4C:
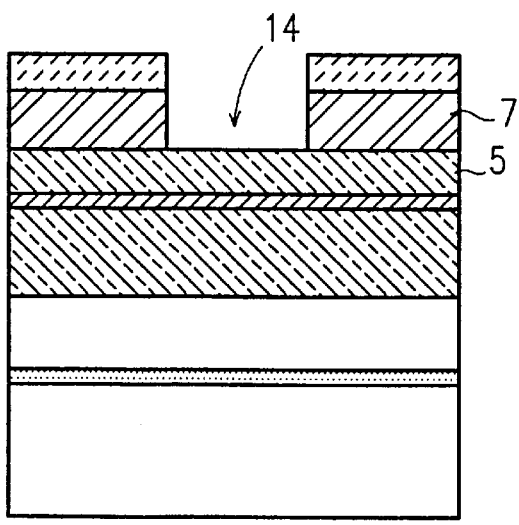
Figure 4D:
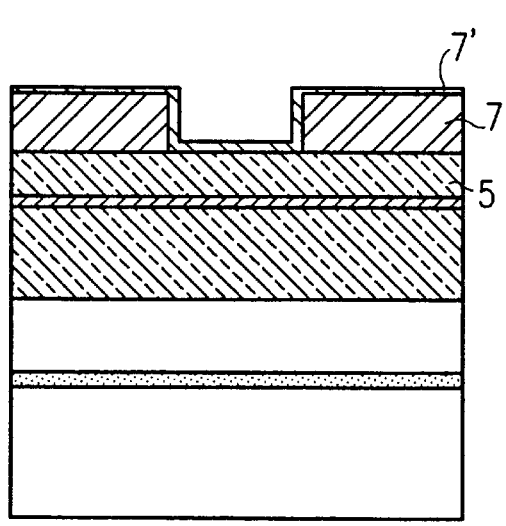

Next, the wafer is treated with wet etching or dry etching. As shown in FIG. 4C, the N-type $Al_{0.05}Ga_{0.95}N$ internal current constricting layer 7 is etched by using, for example, the above-described RIE or ECR-RIBE method to form a deeper opening 14 until the surface of the Mg-doped $Al_{0.1}Ga_{0.9}N$ cladding layer 5 is exposed.

Subsequently, the resist mask 12 is removed by a hydrofluoric acid group etching solution or an organic solvent.

Then, the wafer is again placed on the susceptor of the MOCVD apparatus. In the same manner as that in Example 1, before proceeding to the step of raising the substrate temperature to about 1050° C. so as to cause regrowth of an Mg-doped $Al_{0.1}Ga_{0.9}N$ cladding layer 8, an Mg-doped $Al_{0.05}Ga_{0.95}N$ surface protecting layer 7' (FIG. 4D) containing Al is grown at a substrate temperature of about 400 to about 650° C. so as to have a thickness of about 10 to about 20 nm. The Mg-doped $Al_{0.05}Ga_{0.95}N$ surface protecting layer 7' is formed so as to cover the exposed surface of the Mg-doped $Al_{0.1}Ga_{0.9}N$ cladding layer 5 and the surfaces of the N-type $Al_{0.05}Ga_{0.95}N$ internal current constricting layer 7.

At this point, the surface protecting layer 7' laminated at a low substrate temperature is in a polycrystalline state. However, during the step of raising the substrate temperature to cause regrowth of the Mg-doped $Al_{0.1}Ga_{0.9}N$ cladding layer 8 on the surface of the surface protecting layer 7', the surface protecting layer 7' transforms from the polycrystalline state to the single crystalline state. Thus, there are no significant adverse effects on the device characteristics.

Figure 4E:
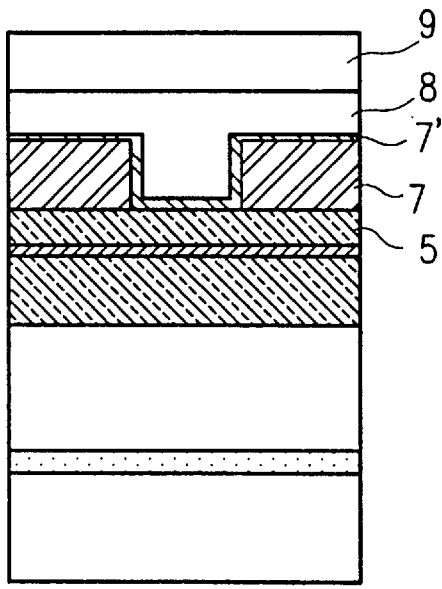

Then, the substrate temperature is raised to about 1050° C. and, as shown in FIG. 4E, the Mg-doped $Al_{0.1}Ga_{0.9}N$ cladding layer 8 with a thickness of about 0.7 to about 1 μm is grown on the surface protecting layer 7', and an Mg-doped GaN contact layer 9 with a thickness of about 0.5 to about 1 μm is grown on the Mg-doped $Al_{0.01}Ga_{0.9}N$ cladding layer 8.

Figure 4F:
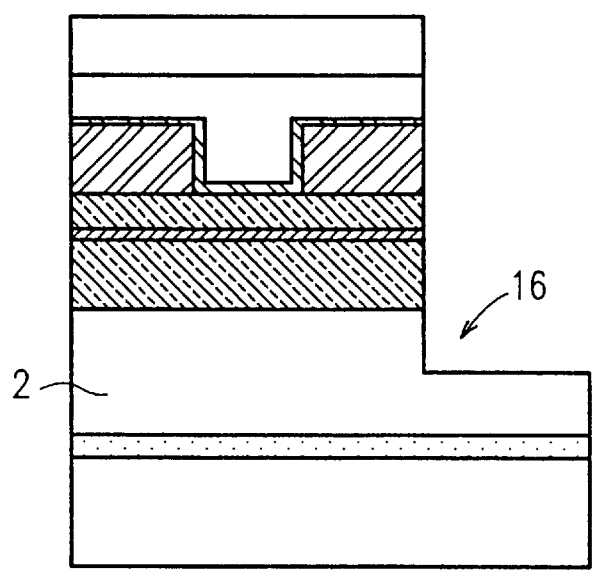

Next, the wafer is taken out from the MOCVD apparatus. In an $N_2$ atmosphere, the wafer is annealed at a temperature of about 800° C. so that the Mg-doped layers are transformed to be P-type. Then, as shown in FIG. 4F, in order to attach the N-side electrode 11, etching 16 is performed until the N-type GaN buffer layer 2 is exposed.

Figure 4G:
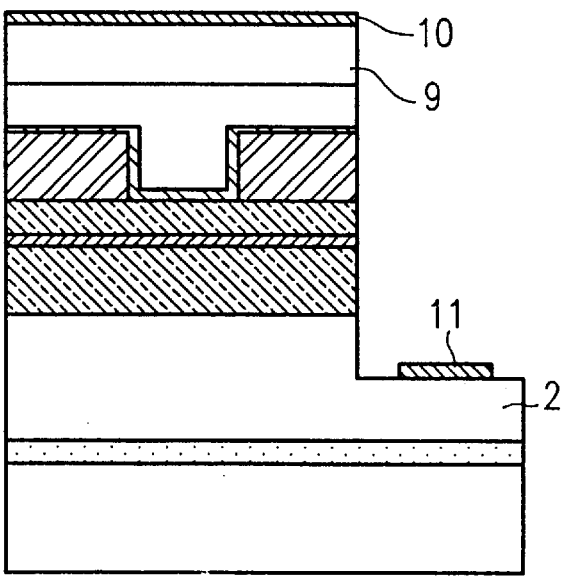

Then, as shown in FIG. 4G, a P-side electrode 10 is formed on the P-type GaN contact layer 9, and the N-side electrode 11 is formed on the N-type GaN buffer layer 2.

In the above-described manner, the gallium nitride group compound semiconductor laser having the structure shown in FIG. 3 is completed.

In the same manner as that in Example 1, the surface protecting layer 7' is formed so as to cover the exposed surface of the Mg-doped $Al_{0.1}Ga_{0.9}N$ cladding layer 5 and the surfaces of the N-type $Al_{0.05}Ga_{0.95}N$ internal current constricting layer 7. Therefore, the same effect as that in Example 1 can be obtained in the gallium nitride group compound semiconductor laser in Example 2.

EXAMPLE 3

Figure 5:
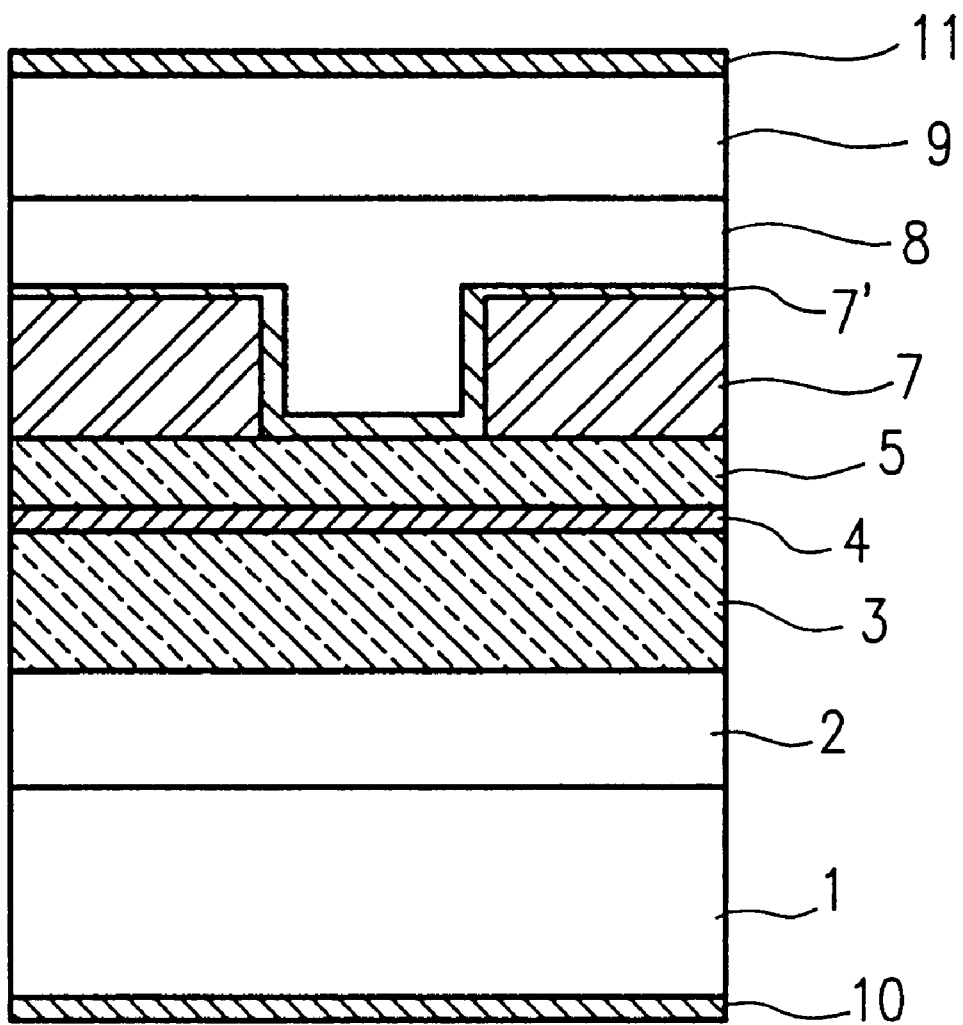
FIG. 5 is a schematic cross-sectional view showing a gallium nitride group compound semiconductor laser according to Example 3 of the present invention.

FIG. 5 shows a gallium nitride group compound semiconductor light-emitting device according to Example 3 of the present invention. The gallium nitride group compound semiconductor laser in Example 3 is fabricated also by MOCVD method. The semiconductor laser in Example 3 employs a low resistance SiC substrate. Regarding a group V material, group III materials, a P-type impurity, an N-type impurity and carrier gases, the same materials as those in Examples 1 and 2 are used.

The gallium nitride group compound semiconductor laser in Example 3 employs materials different from those in Example 1 but has the same cross-sectional structure as that in Example 1.

Hereinafter, the production steps of the gallium nitride group compound semiconductor laser in Example 3 will be described with reference to FIGS. 6A to 6G.

First of all, in order to perform a first crystal growth, a low resistance P-type SiC substrate 1 is placed on the susceptor of the MOCVD apparatus. Next, the substrate temperature is raised to about 1200° C. and surface treatment is conducted. Next, the temperature of the low resistance P-type SiC substrate 1 is lowered to about 1050° C. Thereafter, as show in FIG. 6A, an Mg-doped GaN buffer layer 2 is grown on the low resistance P-type SiC substrate 1 so as to have a thickness of about 0.5 to about 1 μm.

Next, an Mg-doped $Al_{0.1}Ga_{0.9}N$ cladding layer 3 is grown on the Mg-doped GaN buffer layer 2 so as to have a thickness of about 0.7 to 1 μm. Then, the substrate temperature is lowered to be a temperature between about 800 and about 850° C., and an non-doped $In_{0.15}Ga_{0.85}N$ active layer 4 is grown so as to have a thickness of about 3 to about 80 nm. Thereafter, the substrate temperature is raised to about 1050° C., and an N-type $Al_{0.1}Ga_{0.9}N$ cladding layer 5 with a thickness of about 0.1 to about 0.3 μm and an Mg-doped $Al_{0.05}Ga_{0.95}N$ internal current constricting layer 7 with a thickness of about 0.5 μm are sequentially grown in this order. The internal current constricting layer 7 may be a high resistance layer in which no current flows.

Figure 6A:
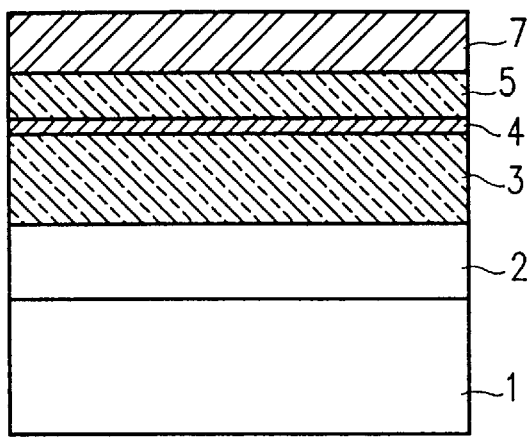
FIGS. 6A to 6G show production steps of the gallium nitride group compound semiconductor laser in FIG. 5 according to Example 3 of the present invention.
Figure 6B:
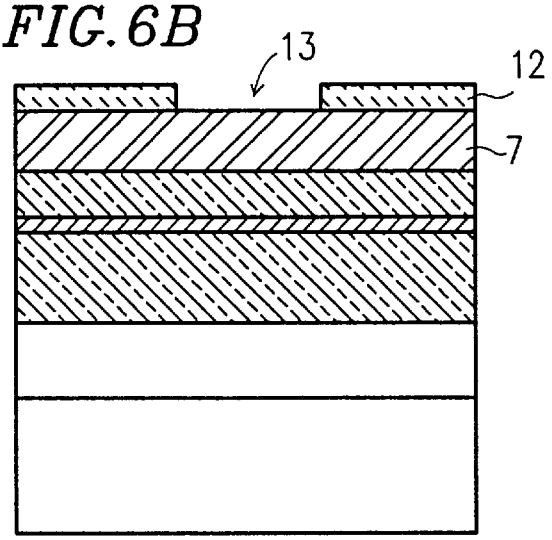

Next, the wafer is taken out from the growth chamber in the MOCVD apparatus. Then, an $SiO_X$ film, an $SiN_X$ film or a resist mask 12 is formed on the Mg-doped $Al_{0.05}Ga_{0.95}N$ internal current constricting layer 7. Thereafter, as shown in FIG. 6B, a part of the $SiO_X$ film, the $SiN_X$ film or the resist mask 12 is removed using a common photolithography technique so as to form a stripe-shaped opening 13.

Figure 6C:
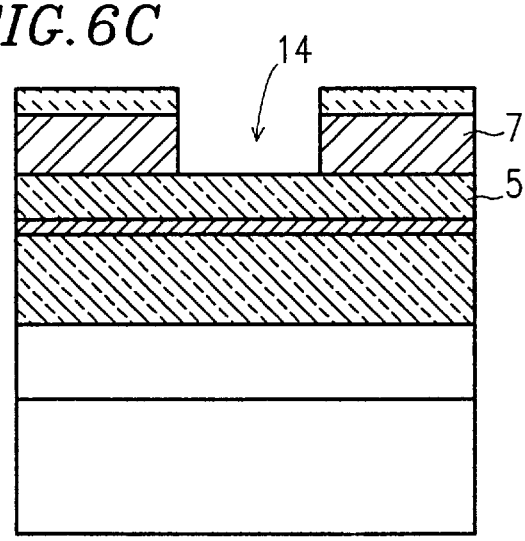

Then, the wafer is treated with wet etching or dry etching in an ambient atmosphere. As shown in FIG. 6C, the Mg-doped $Al_{0.05}Ga_{0.95}N$ internal current constricting layer 7 is etched to form a deeper opening 14 by using, for example, the above-described RIE or ECR-RIBE method until the surface of the N-type $Al_{0.1}Ga_{0.9}N$ cladding layer 5 is exposed.

Figure 6D:
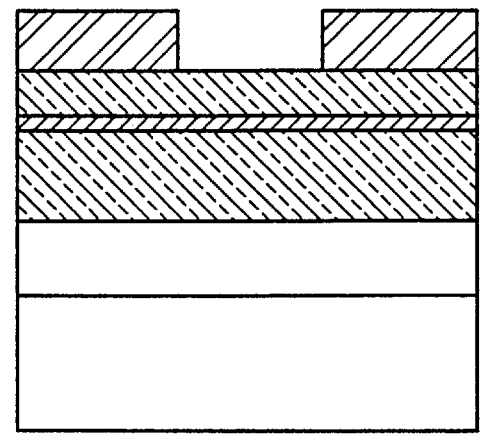

Subsequently, as shown in FIG. 6D, the resist mask 12 is removed by a hydrofluoric acid group etching solution or an organic solvent.

Figure 6E:
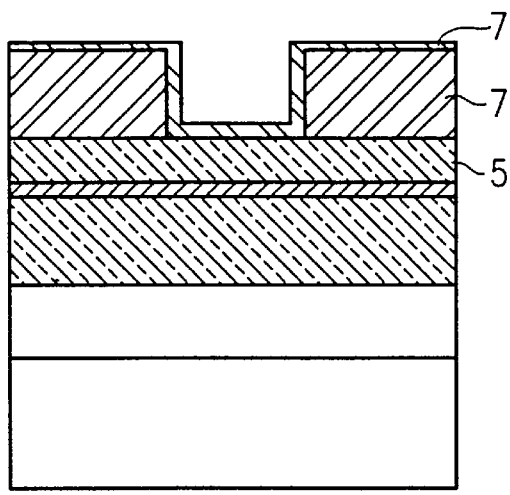

Then, the wafer is again placed on the susceptor of the MOCVD apparatus. In the same manner as that in each of the above-described Examples, an N-type $Al_{0.05}Ga_{0.95}N$ surface protecting layer 7' containing Al is grown at a substrate temperature of about 400 to about 650° C. so as to have a thickness of about 10 to 20 nm. As shown in FIG. 6E, the N-type $Al_{0.05}Ga_{0.95}N$ surface protecting layer 7' is formed so as to cover the exposed surface of the N-type $Al_{0.1}Ga_{0.9}N$ cladding layer 5 and the surfaces of the Mg-doped $Al_{0.05}Ga_{0.95}N$ internal current constricting layer 7.

At this point, the surface protecting layer 7' laminated at a low substrate temperature is in a polycrystalline state. However, during the step of raising the substrate temperature to cause regrowth of an N-type $Al_{0.1}Ga_{0.9}N$ cladding layer 8 on the surface of the surface protecting layer 71, the surface protecting layer 71 transforms from the polycrystalline state to the single crystalline state. Thus, there are no significant adverse effects on the device characteristics.

Figure 6F:
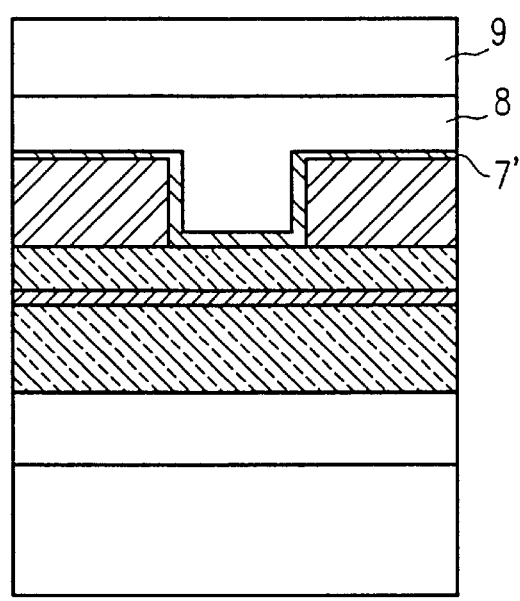

Next, the substrate temperature is raised to about 1050° C. Then, as shown in FIG. 6F, the N-type $Al_{0.01}Ga_{0.9}N$ cladding layer 8 and an N-type GaN contact layer 9 are sequentially grown so as to have thicknesses of about 0.7 to about 1 μm and about 0.5 to about 1 μm, respectively.

Figure 6G:
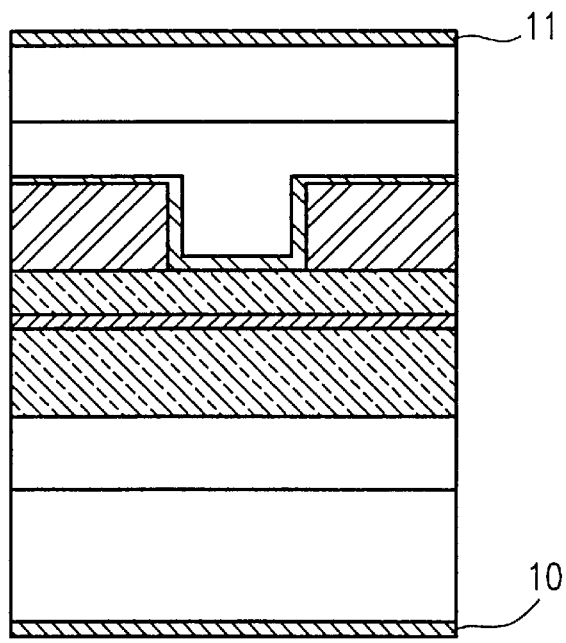

Then, the wafer is taken out from the MOCVD apparatus. In an $N_2$ atmosphere, the wafer is annealed at a temperature of about 800° C. so that the Mg-doped layers are transformed to be P-type. Thereafter, as shown in FIG. 6G, an N-side electrode 11 is formed on the N-type GaN contact layer 9, and a P-side electrode 10 is formed on a bottom surface of the low resistance P-type SiC substrate 1.

In the above-described manner, the gallium nitride group compound semiconductor laser having the structure shown in FIG. 5 is completed.

In the same manner as that in Example 1, the gallium nitride group compound semiconductor laser in Example 3 includes the surface protecting layer 7' covering the exposed surface of the N-type $Al_{0.1}Ga_{0.9}N$ cladding layer 5 and the surfaces of the Mg-doped $Al_{0.05}Ga_{0.95}N$ internal current constricting layer 7. Therefore, the same effect as that in Example 1 can be obtained.

Moreover, according to Example 3 of the present invention, the upper cladding layer 5 and the regrowth cladding layer 8 are both N-type. Therefore, because of the reason described above, the gallium nitride group compound semiconductor laser in Example 3 has an improved light confinement ability as compared to those in Examples 1 and 2 each having the P-type upper cladding layers 5 and the P-type regrowth cladding layers 8.

EXAMPLE 4

Figure 7:
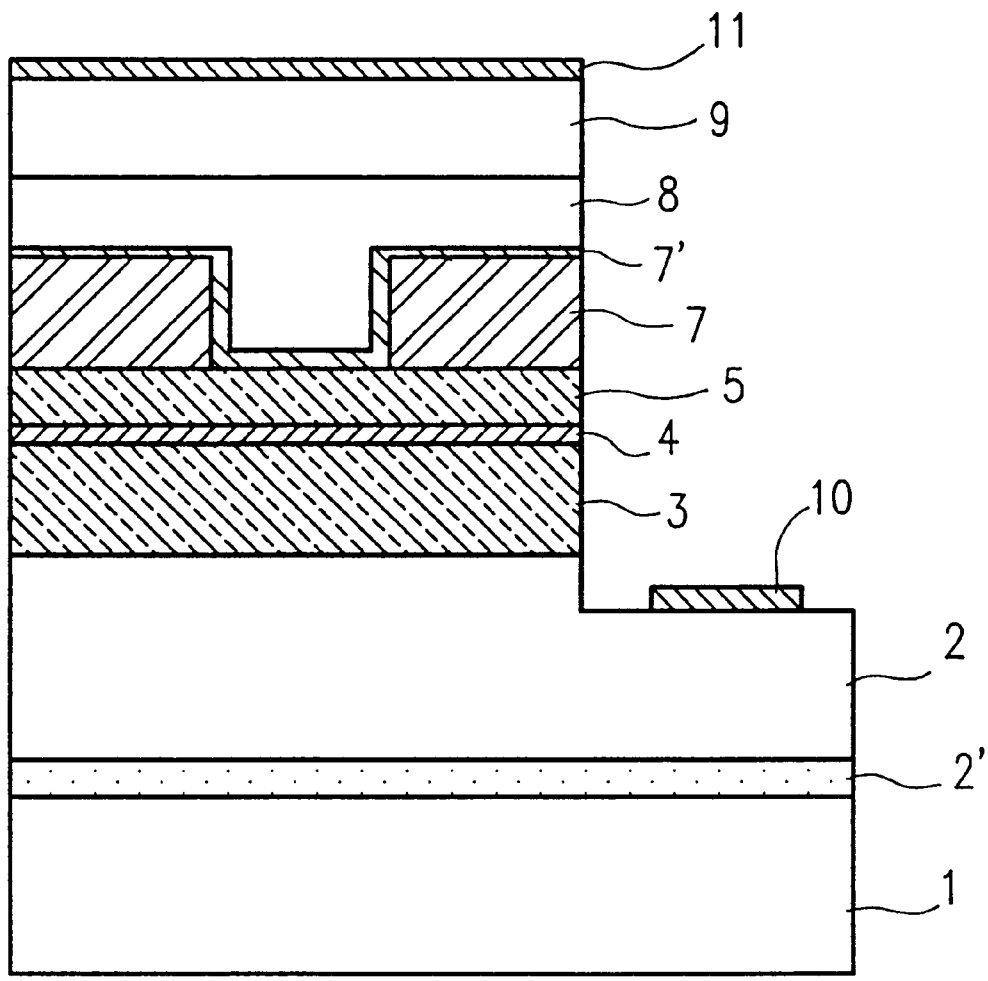
FIG. 7 is a schematic cross-sectional view showing a gallium nitride group compound semiconductor laser according to Example 4 of the present invention.

FIG. 7 shows a gallium nitride group compound semiconductor light-emitting device according to Example 4 of the present invention. The gallium nitride group compound semiconductor laser in Example 4 is fabricated also by the MOCVD method. In Example 4, a sapphire substrate is used. Regarding a group V material, group III materials, a P-type impurity, an N-type impurity and carrier gases, the same materials as those in each of the above-described Examples are used in Example 4.

Hereinafter, the production steps of the gallium nitride group compound semiconductor laser in Example 4 of the present invention will be described with reference to FIGS. 8A to 8G.

Figure 8A:
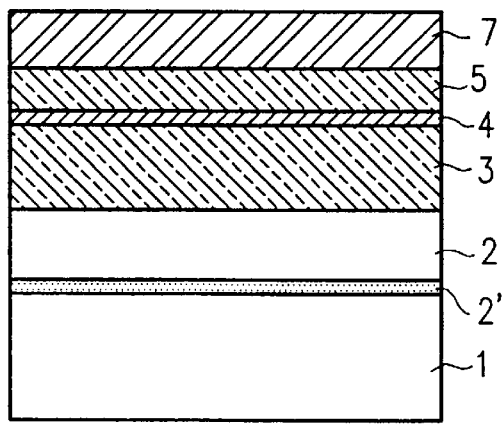

First of all, in order to perform a first crystal growth, a sapphire substrate 1 is placed on the susceptor of the MOCVD apparatus. Then, the substrate temperature is raised to about 1200° C. and surface treatment is conducted. Thereafter, the temperature of the sapphire substrate 1 is lowered to be a temperature between about 500 and about 650° C. Then, as shown in FIG. 8A, a GaN buffer layer, an AlN buffer layer, or an $Al_{0.1}Ga_{0.9}N$ buffer layer 2' is grown on the sapphire substrate 1 so as to have a thickness of about 50 nm to about 2 μm.

Next, the substrate temperature is raised to about 1050° C., and an Mg-doped GaN buffer layer 2 is grown so as to have a thickness of about 0.5 to about 1 μm.

Thereafter, an Mg-doped $Al_{0.1}Ga_{0.9}N$ cladding layer 3 is grown on the Mg-doped GaN buffer layer 2 so as to have a thickness of about 0.7 to about 1 μm. Then, the substrate temperature is lowered to be a temperature between about 800 and about 850° C., and an non-doped $In_{0.15}Ga_{0.85}N$ active layer 4 is grown so as to have a thickness of about 3 to about 80 nm.

Next, the substrate temperature is raised to about 1050° C. Then, an N-type $Al_{0.1}Ga_{0.9}N$ cladding layer 5 is grown so as to have a thickness of about 0.1 to about 0.3 μm, and an Mg-doped $Al_{0.05}Ga_{0.95}N$ internal current constricting layer 7 is grown so as to have a thickness of about 0.5 μm. The internal current constricting layer 7 may be a high resistance layer in which no current flows.

Then, the wafer is taken out from the growth chamber in the MOCVD apparatus. Thereafter, an $SiO_X$ film, an $SiN_X$ film, or a resist mask 12 is formed on the Mg-doped $Al_{0.05}Ga_{0.95}N$ internal current constricting layer 7.

Figure 8B:
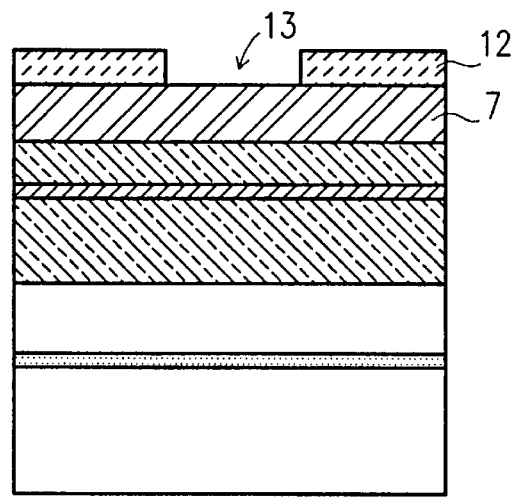

Then, as shown in FIG. 8B, a part of the $SiO_X$ film, the $SiN_X$ film, or the resist mask 12 on the Mg-doped $Al_{0.05}Ga_{0.95}N$ internal current constricting layer 7 is removed using a common photolithography technique so as to form a stripe-shaped opening 13.

Figure 8C:
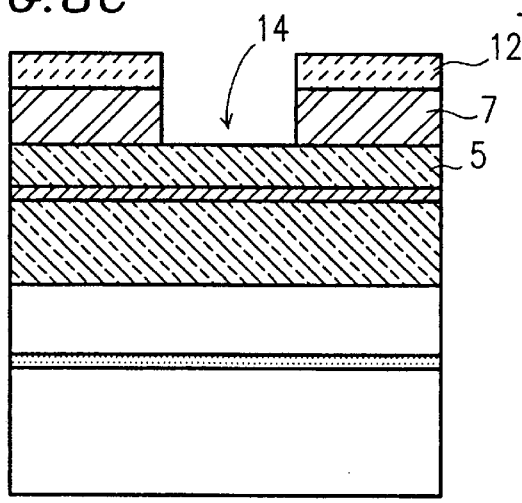

Then, the wafer is treated with wet etching or dry etching. As shown in FIG. 8C, the Mg-doped $Al_{0.05}Ga_{0.95}N$ internal current constricting layer 7 is etched to form a deeper opening 14 until the surface of the N-type $Al_{0.1}Ga_{0.9}N$ cladding layer 5 is exposed. The etching is performed by using, for example, a gas such as $BCl_3/Ar$ or $CCl_2F_2/Ar$ in the above-described RIE method or the ECR-RIBE method.

Figure 8D:
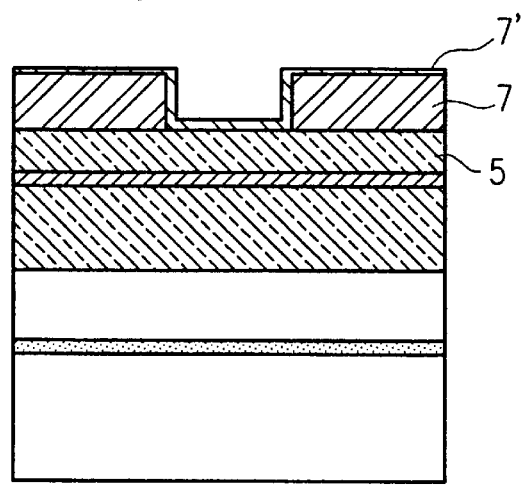

Next, as shown in FIG. 8D, the resist mask 12 is removed by a hydrofluoric acid group etching solution or an organic solvent. Then, the wafer is again placed on the susceptor of the MOCVD apparatus. In the same manner as that in each of the above-described Examples, an N-type $Al_{0.05}Ga_{0.95}N$ surface protecting layer 7' containing Al is grown at a substrate temperature of about 400 to about 650° C. so as to have a thickness of about 10 to about 20 nm. The N-type $Al_{0.05}Ga_{0.95}N$ surface protecting layer 7' is formed so as to cover the exposed surface of the N-type $Al_{0.1}Ga_{0.9}N$ cladding layer 5 and the surfaces of the Mg-doped $Al_{0.05}Ga_{0.95}N$ internal current constricting layer 7.

At this point, the surface protecting layer 7' laminated at a low substrate temperature is in a polycrystalline state. However, during the step of raising the substrate temperature to cause regrowth of an N-type $Al_{0.1}Ga_{0.9}N$ cladding layer 8 on the surface protecting layer 7', the surface protecting layer 7' transforms from the polycrystalline state to the single crystalline state. Thus, there are no significant adverse effects on the device characteristics.

Next, the substrate temperature is raised to about 1050° C. Then, as shown in FIG. 8E, the N-type $Al_{0.1}Ga_{0.9}N$ cladding layer 8 is grown so as to have a thickness of about 0.7 to about 1 μm, and an N-type GaN contact layer 9 is grown so as to have a thickness of about 0.5 to about 1 μm.

Thereafter, the wafer is taken out from the MOCVD apparatus. In an $N_2$ atmosphere, the wafer is annealed at a temperature of about 800° C. so that the Mg-doped layers are transformed to be P-type. Then, as shown in FIG. 8F, in order to attach a P-side electrode 10, etching 16 is preformed until the P-type GaN layer 2 is exposed.

Next, as shown in FIG. 8G, an N-side electrode 11 is formed on the N-type GaN contact layer 9, and the P-side electrode 10 is formed on the P-type GaN layer 2.

In the above-described manner, the gallium nitride group compound semiconductor laser having the structure shown in FIG. 7 is completed.

In the same manner as that in Example 1, the gallium nitride group compound semiconductor laser in Example 4 includes the surface protecting layer 7' covering the exposed surface of the N-type $Al_{0.1}Ga_{0.9}N$ cladding layer 5 and the surfaces of the Mg-doped $Al_{0.05}Ga_{0.95}N$ internal current constricting layer 7. Therefore, the same effect as that in Example 1 can be obtained.

EXAMPLE 5

Figure 9:
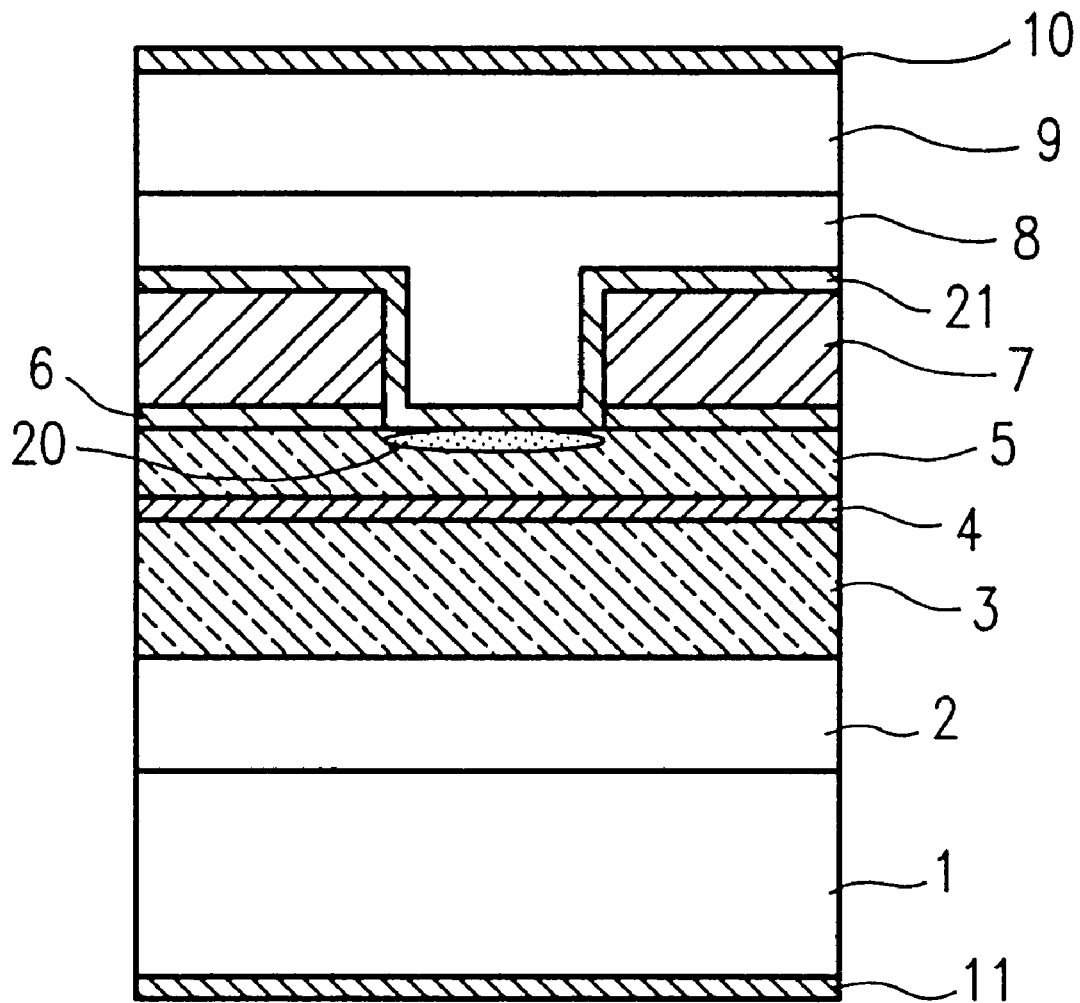
FIG. 9 is a schematic cross-sectional view showing a gallium nitride group compound semiconductor laser according to Example 5 of the present invention.

FIG. 9 shows a gallium nitride group compound semiconductor light-emitting device according to Example 5 of the present invention. The gallium nitride group compound semiconductor laser in Example 5 differs from those in Examples 1 to 4 in the following points. The gallium nitride group compound semiconductor laser in Example 5 includes a re-evaporation layer 6 provided on a top surface of an upper cladding layer 5; a high impurity concentration region 20 provided near a surface of the upper cladding layer 5 exposed by etching; and an impurity evaporation preventing layer 21 (a surface protecting layer) provided so as to cover the high impurity concentration region 20 and surfaces of an internal current constricting layer 7.

The gallium nitride group compound semiconductor laser according to Example 5 of the present invention is fabricated also by the MOCVD method. The gallium nitride group compound semiconductor laser in Example 5 employs a low resistance SiC substrate. Regarding a group V material, group III materials, a P-type impurity, an N-type impurity and carrier gases, the same materials as those in each of the above-described Examples are employed.

Hereinafter, the production steps of the gallium nitride group compound semiconductor laser in Example 5 will be described with reference to FIGS. 10A to 10K.

Figure 10A:
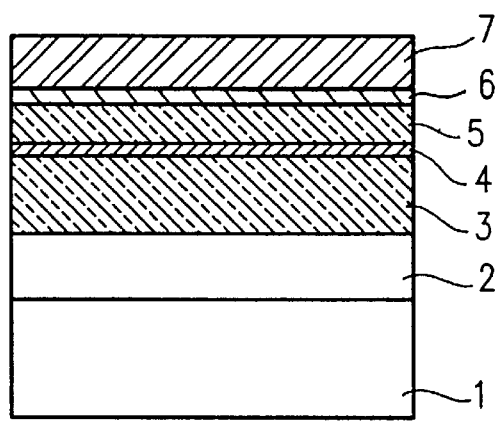

First of all, in order to perform a first crystal growth, a low resistance N-type SiC substrate 1 is placed on the susceptor of the MOCVD apparatus. Then, the substrate temperature is raised to about 1200° C. and surface treatment is conducted. Next, the temperature of the low resistance N-type SiC substrate 1 is lowered to about 1050° C. Thereafter, as shown in FIG. 10A, an N-type GaN buffer layer 2 is grown on the low resistance N-type SiC substrate 1 so as to have a thickness of about 0.05 to about 1 µm.

Next, an N-type $Al_{0.1}Ga_{0.9}N$ cladding layer 3 is grown on the N-type GaN buffer layer 2 so as to have a thickness of about 0.7 to about 1 µm. Subsequently, the substrate temperature is lowered to be a temperature between about 800 and about 850° C., and an non-doped $In_{0.15}Ga_{0.85}N$ active layer 4 is grown so as to have a thickness of about 3 to about 80 nm. Then, the substrate temperature is raised to about 1050° C., and an Mg-doped $Al_{0.1}Ga_{0.9}N$ cladding layer 5 is grown so as to have a thickness of about 0.1 to about 0.3 µm. Then, the substrate temperature is lowered to be a temperature between about 800 and about 850° C., and the Mg-doped InN re-evaporation layer 6 is grown so as to have a thickness of about 3 nm. The substrate temperature is lowered to about 400° C. Then, while raising the substrate temperature to be about 400 to about 1050° C., the N-type $Al_{0.05}Ga_{0.95}N$ internal current constricting layer 7 is grown so as to have a thickness of about 0.5 µm.

Figure 10B:
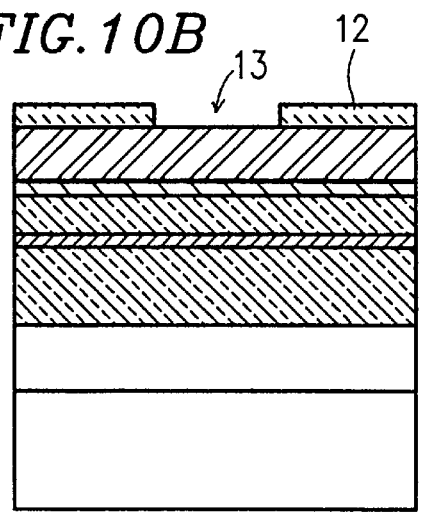

Next, the wafer is taken out from the growth chamber in the MOCVD apparatus. Then, an $SiO_X$ film, an $SiN_X$ film or a resist mask 12 is formed on the N-type $Al_{0.05}Ga_{0.95}N$ internal current constricting layer 7. As shown in FIG. 10B, a part of the $SiO_X$ film, the $SiN_X$ film or the resist mask 12 on the N-type $Al_{0.05}Ga_{0.95}N$ internal current constricting layer 7 is removed using a common photolithography technique to form a stripe-shaped opening 13.

Figure 10C:
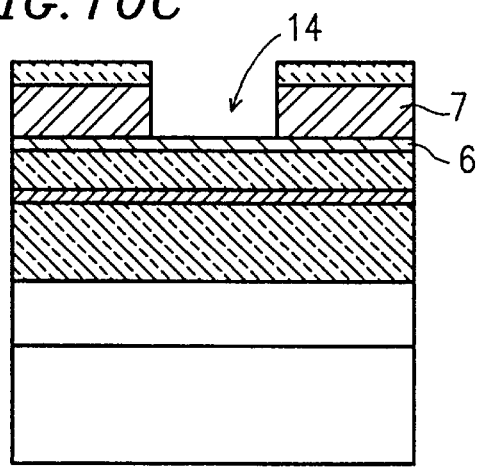

Then, the wafer is treated with wet etching or dry etching in an ambient atmosphere. As shown in FIG. 10C, the N-type $Al_{0.05}Ga_{0.95}N$ internal current constricting layer 7 is etched to form a deeper opening 14 until the surface of the Mg-doped InN re-evaporation layer 6 is exposed. The etching is performed by, for example, using a gas such as $BCl_3/Ar$ or $CCl_2F_2/Ar$ in the above-described RIE or ECR-RIBE method.

Figure 10D:
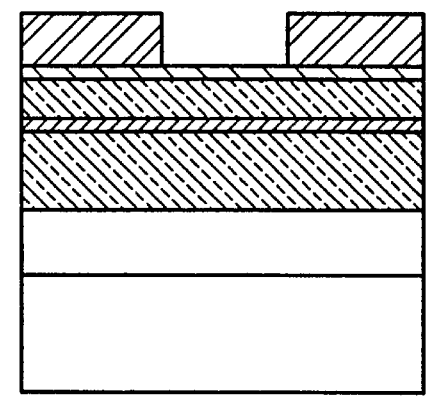

Next, as shown in FIG. 10D, the resist mask 12 is removed by a hydrofluoric acid group etching solution or an organic solvent.

Figure 10E:
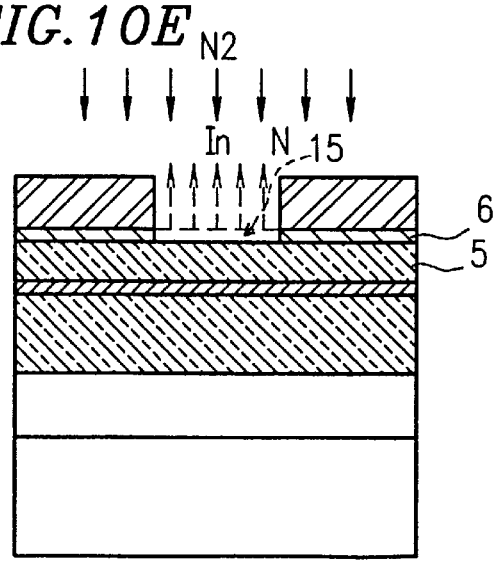
Figure 10F:
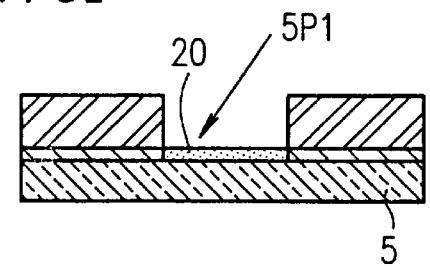

Thereafter, the wafer is again placed on the susceptor of the MOCVD apparatus. As shown in FIG. 10E, the Mg-doped InN layer 6 is re-evaporated in an atmosphere including $N_2$ and $NH_3$ at a substrate temperature of about 550° C. so that the surface of the Mg-doped $Al_{0.1}Ga_{0.9}N$ cladding layer 5 is exposed (an exposed portion 15 is thus obtained).

Next, an Mg-heavily-doped region 20 (a high impurity concentration region) is formed, for example, by: depositing several atomic layers of Mg element on the exposed surface of the Mg-doped $Al_{0.1}Ga_{0.9}N$ cladding layer 5 (5P1 in FIG. 10F); injecting ions thereto (5P2 in FIG. 10G); or providing an Mg-heavily-doped $Al_{0.05}Ga_{0.95}N$ layer thereon (5P3 in FIG. 10H), at a predetermined temperature. As a material for a P-type impurity, $Cp_2Mg$ having a low vapor pressure and a low temperature dependency is preferable.

The Mg impurity concentration in the Mg-heavily-doped region 20 is preferably in the range of about $1 \times 10^{18}$ to about $1 \times 10^{19}$ $cm^{-3}$.

An organic metal element as a P-type impurity may be DMZn, DEZn, or the like. The substrate temperature for forming a P-type high impurity concentration region is preferably in the range of about 400 to about 800° C.

Next, a second crystal growth is performed. As shown in FIG. 10, in order to prevent re-evaporation of Mg from the Mg-heavily-doped region 20 on the exposed surface of the Mg-doped $Al_{0.1}Ga_{0.9}N$ cladding layer 5, the Mg-doped $Al_{0.05}Ga_{0.95}N$ impurity evaporation preventing layer 21 is grown at a substrate temperature of about 400° C. to 650° C. so as to have a thickness of about 10 to about 20 nm.

At this point, the impurity evaporation preventing layer 21 laminated at a low substrate temperature is in a polycrystalline state. However, during the step of raising the substrate temperature to cause regrowth of an Mg-doped $Al_{0.1}Ga_{0.9}N$ cladding layer 8 on the impurity evaporation preventing layer 21, the impurity evaporation preventing layer 21 transforms from the polycrystalline state to the single crystalline state. Therefore, there are no significant adverse effects on the device characteristics.

Next, the substrate temperature is raised to about 1050° C. Then, as shown in FIG. 10J, the Mg-doped $Al_{0.1}Ga_{0.9}N$ cladding layer 8 is grown so as to have a thickness of about 0.7 to about 1 µm, and an Mg-doped GaN contact layer 9 is grown so as to have a thickness of about 0.5 to about 1 µm. During the step of raising the substrate temperature, Mg deposited on the surface of the Mg-doped cladding layer 5 is diffused into the $Al_{0.1}Ga_{0.9}N$ cladding layer 5.

Then, the wafer is taken out from the MOCVD apparatus. Then, the wafer is annealed in an $N_2$ atmosphere at a temperature of about 800° C. so that the Mg-doped layers are transformed to be P-type. As shown in FIG. 10K, a P-side electrode 10 is formed on a top surface of the P-type GaN contact layer 9, and an N-side electrode 11 is formed on a bottom surface of the low resistance N-type SiC substrate 1.

In the above-described manner, the gallium nitride group compound semiconductor laser having the structure shown in FIG. 9 is completed.

According to the gallium nitride group compound semiconductor laser in Example 5, the re-evaporation layer is re-evaporated at a low temperature, and the heavily-doped region 20 is formed by: depositing P-type impurities on the exposed surface of the cladding layer; injecting ions thereto; or providing the heavily-doped $Al_{0.05}Ga_{0.95}N$ layer thereon. In order to prevent the re-evaporation of the P-type impurity, the $Al_{0.05}Ga_{0.95}N$ impurity evaporation preventing layer 21 (a surface protecting layer) is formed. As a result, a lack of the carrier at the regrowth interface can be prevented. Consequently, series resistance at the regrowth interface is reduced. Thus, a highly-reliable internal current constricting type gallium nitride semiconductor laser or light-emitting device having a low forward voltage and a satisfactory regrowth interface can be realized.

EXAMPLE 6

Figure 11:
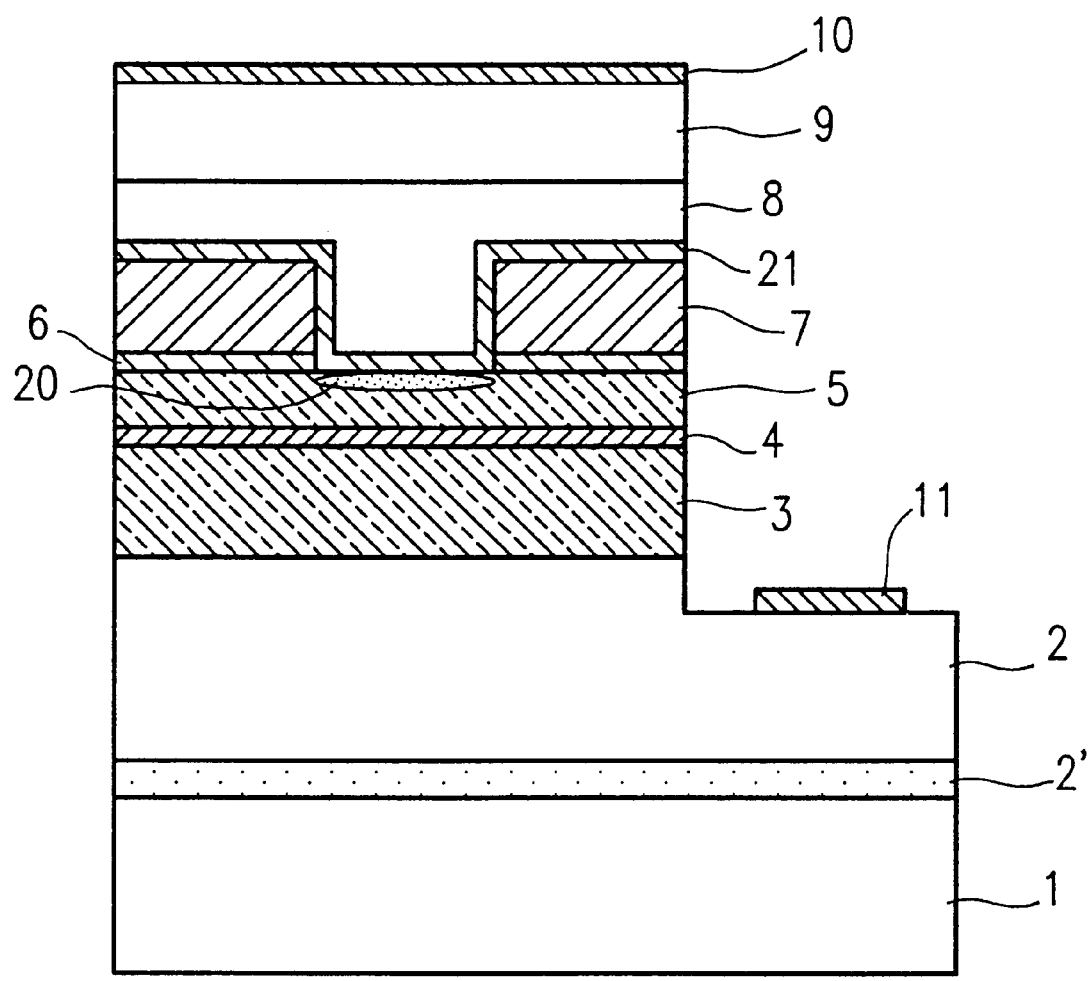
FIG. 11 is a schematic cross-sectional view showing a gallium nitride group compound semiconductor laser according to Example 6 of the present invention.

FIG. 11 shows a gallium nitride group compound semiconductor light-emitting device according to Example 6 of the present invention. The gallium nitride group compound semiconductor laser in Example 6 differs from that in Example 5 mainly in the following points. In the gallium nitride group compound semiconductor laser in Example 6, a GaN buffer layer, an AlN buffer layer, or an $Al_{0.1}Ga_{0.9}N$ buffer layer 2' is formed on a sapphire substrate 1, and an N-side electrode 11 is formed on an exposed surface of an N-type GaN buffer layer 2.

The gallium nitride group compound semiconductor laser according to Example 6 of the present invention is fabricated also by the MOCVD method and employs a sapphire substrate. Regarding a group V material, group III materials, a P-type impurity, an N-type impurity and carrier gases, the same materials as those in each of the above-described Examples are used.

Hereinafter, the production steps of the gallium nitride group compound semiconductor laser in Example 6 will be described with reference to FIGS. 12A to 12K.

Figure 12A:
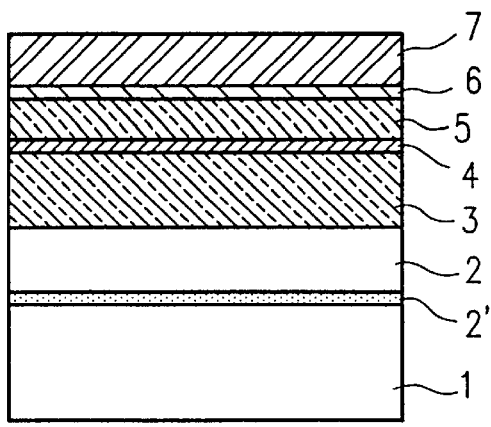
FIGS. 12A to 12K show production steps of the gallium nitride group compound semiconductor laser in FIG. 11 according to Example 6 of the present invention.

First of all, in order to perform a first crystal growth, the sapphire substrate 1 is placed on the susceptor of the MOCVD apparatus. Then, the substrate temperature is raised to about 1200° C. and surface treatment is conducted. Thereafter, the temperature of the sapphire substrate 1 is lowered to be a temperature between about 500 and about 650° C., and as shown in FIG. 12A, the GaN buffer layer, the AlN buffer layer, or the $Al_{0.1}Ga_{0.9}N$ buffer layer 2' is grown on the sapphire substrate 1 so as to have a thickness of about 50 nm to about 2 μm. Next, the substrate temperature is raised to about 1050° C. The N-type GaN buffer layer 2 is grown so as to have a thickness of about 0.5 to about 1 μm and then, an N-type $Al_{0.1}Ga_{0.9}N$ cladding layer 3 is grown on the N-type GaN buffer layer 2 so as to have a thickness of about 0.7 to about 1 μm.

Next, the substrate temperature is lowered to be a temperature between about 800 and about 850° C., and an non-doped $In_{0.15}Ga_{0.85}N$ active layer 4 is grown so as to have a thickness of about 3 to about 80 nm. Then, the substrate temperature is raised to about 1050° C., and an Mg-doped $Al_{0.1}Ga_{0.9}N$ cladding layer 5 is grown so as to have a thickness of about 0.1 to about 0.3 μm. Thereafter, the substrate temperature is lowered to be a temperature between about 800 and about 850° C., and an Mg-doped InN re-evaporation layer 6 is grown so as to have a thickness of about 3 nm. The substrate temperature is lowered to about 400° C. Then, while raising the substrate temperature to about 1050° C., an N-type $Al_{0.05}Ga_{0.95}N$ internal current constricting layer 7 is grown so as to have a thickness of about 0.5 μm.

Figure 12B:
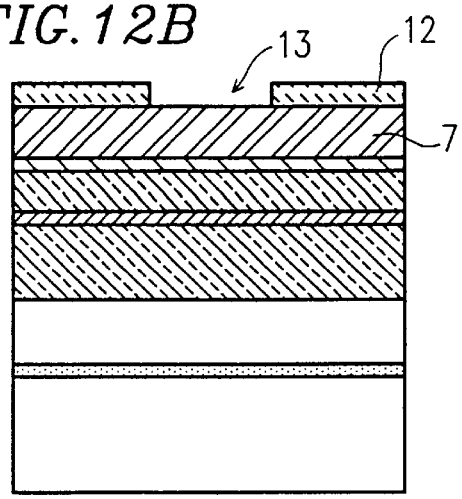

Next, the wafer is taken out from the growth chamber in the MOCVD apparatus. Then, an $SiO_X$ film, an $SiN_X$ film, or a resist mask 12 is formed on the N-type $Al_{0.05}Ga_{0.95}N$ internal current constricting layer 7. Thereafter, as shown in FIG. 12B, a part of the $SiO_X$ film, the $SiN_X$ film, or the resist mask 12 on the N-type $Al_{0.05}Ga_{0.95}N$ internal current constricting layer 7 is removed using a common photolithography technique so as to form a stripe-shaped opening 13.

Figure 12C:
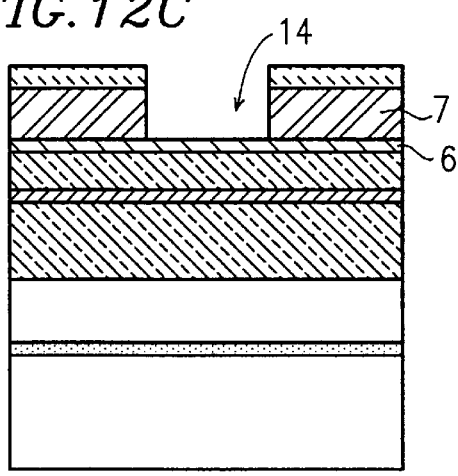
Figure 12D:
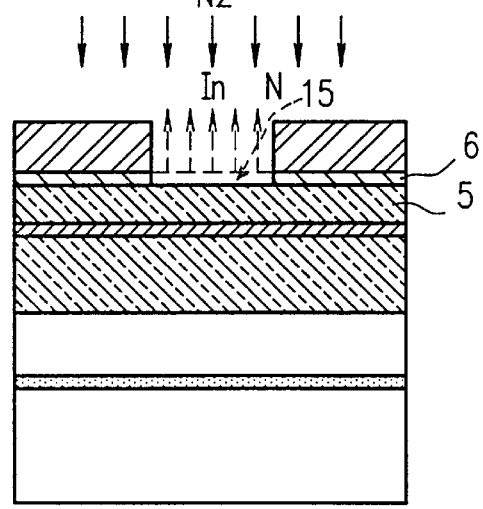
Figure 12E:
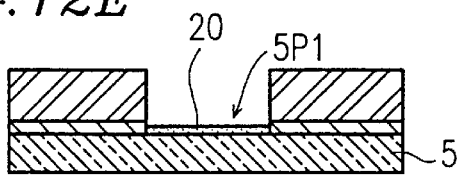
Figure 12F:
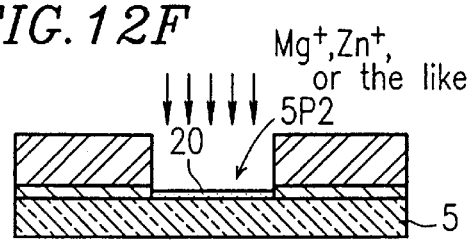
Figure 12G:
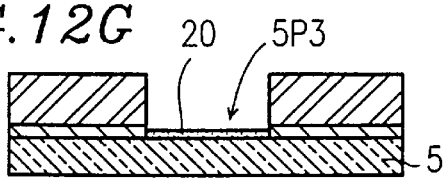

Then, the wafer is treated with wet etching or dry etching in an ambient atmosphere. As shown in FIG. 12C, the N-type $Al_{0.05}Ga_{0.95}N$ internal current constricting layer 7 is etched to form a deeper opening 14 until the surface of the Mg-doped InN re-evaporation layer 6 is exposed. The etching is performed by using, for example, a gas such as $BCl_3$/Ar or $CCl_2F_2$/Ar in the above-described RIE or ECR-RIBE method.

Next, the resist mask 12 is removed by a hydrofluoric acid group etching solution or an organic solvent.

Then, the wafer is again placed on the susceptor of the MOCVD apparatus. In an atmosphere including $N_2$ and $NH_3$, the Mg-doped InN layer 6 is re-evaporated at a substrate temperature of about 550° C. so that the surface of the Mg-doped $Al_{0.1}Ga_{0.9}N$ cladding layer 5 is exposed (an exposed portion 15 is thus formed).

Next, an Mg-heavily-doped region 20 is formed, for example, by: depositing several atomic layers of Mg element on the exposed surface of the Mg-doped $Al_{0.1}Ga_{0.9}N$ cladding layer 5 (5P1 in FIG. 12E); injecting ions thereto (5P2 in FIG. 12F); or providing an Mg-heavily-doped $Al_{0.05}Ga_{0.95}N$ layer thereon (5P3 in FIG. 12G), at a predetermined temperature.

The preferable P-type impurity material and the preferable range of Mg impurity concentration in Example 6 are the same as those in Example 5.

Figure 12H:
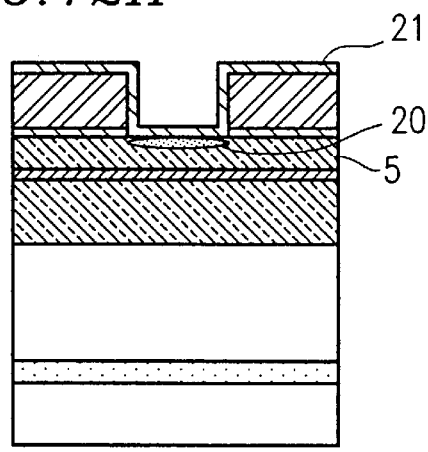

Next, a second crystal growth is performed. As shown in FIG. 12H, in order to prevent the re-evaporation of Mg from the Mg-heavily-doped region 20 on the exposed surface of the Mg-doped $Al_{0.1}Ga_{0.9}N$ cladding layer 5, an Mg-doped $Al_{0.05}Ga_{0.95}N$ impurity evaporation preventing layer 21 is grown at a substrate temperature of about 400 to about 650° C. so as to have a thickness of about 10 to 20 nm.

At this point, the impurity evaporation preventing layer 21 is in a polycrystalline state. However, during the step of raising the substrate temperature to cause regrowth of an Mg-doped $Al_{0.1}Ga_{0.9}N$ cladding layer 8 on the impurity evaporation preventing layer 21, the impurity evaporation preventing layer 21 transforms from the polycrystalline state to the single crystalline state. Therefore, there are no significant adverse effects on the device characteristics.

Figure 12I:
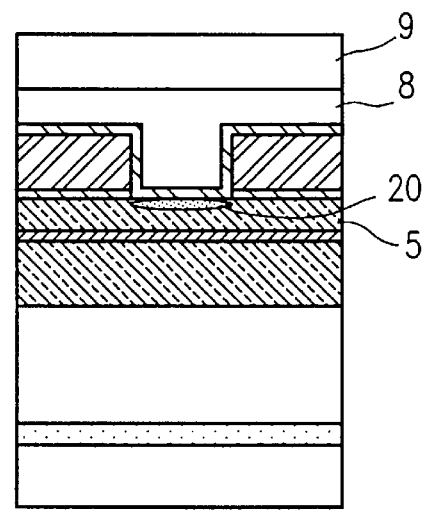

Next, the substrate temperature is raised to about 1050° C. Then, as shown in FIG. 12I, the Mg-doped $Al_{0.1}Ga_{0.9}N$ cladding layer 8 is grown so as to have a thickness of about 0.7 to about 1 μm, and an Mg-doped GaN contact layer 9 is grown so as to have a thickness of about 0.5 to about 1 μm. During the step of raising the substrate temperature, Mg deposited on the surface of the Mg-doped cladding layer 5 is diffused into the Mg-doped $Al_{0.1}Ga_{0.9}N$ cladding layer 5.

Figure 12J:
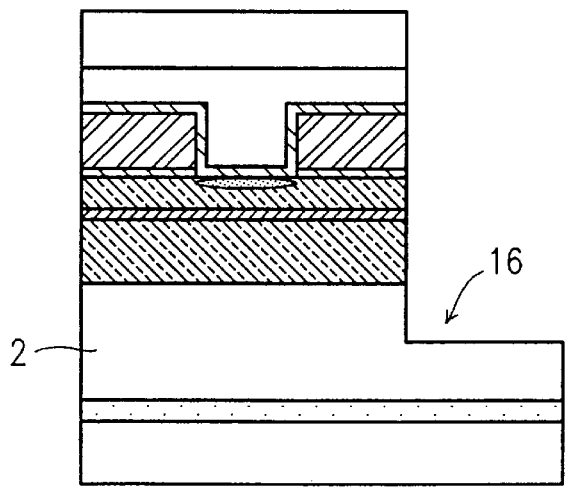

Next, the wafer is taken out from the MOCVD apparatus. Then, in an $N_2$ atmosphere, the wafer is annealed at a temperature of about 800° C. so that the Mg-doped layers are transformed to be P-type. Thereafter, in order to perform an attachment of an N-side electrode, as shown in FIG. 12J, etching 16 is performed until the N-type GaN layer 2 is exposed.

Figure 12K:
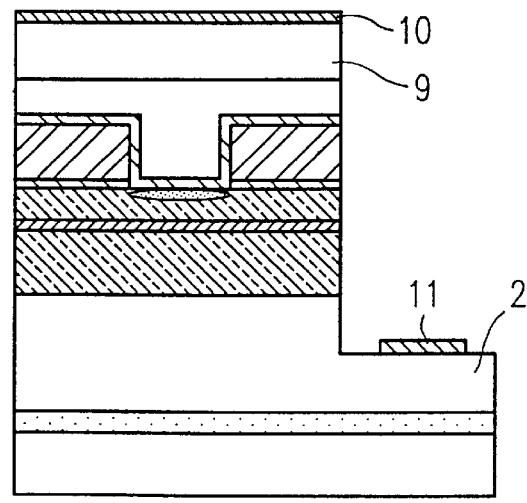

Then, as shown in FIG. 12K, a P-type electrode 10 is formed on a top surface of the P-type GaN contact layer 9, and an N-side electrode 11 is formed on the exposed surface of the N-type GaN layer 2.

In the above-described manner, the gallium nitride group compound semiconductor laser having the structure shown in FIG. 11 is completed.

The gallium nitride group compound semiconductor laser in Example 6 has the same device structure as that in Example 5. Therefore, the same effect as that in Example 5 can be obtained.

EXAMPLE 7

Figure 13:
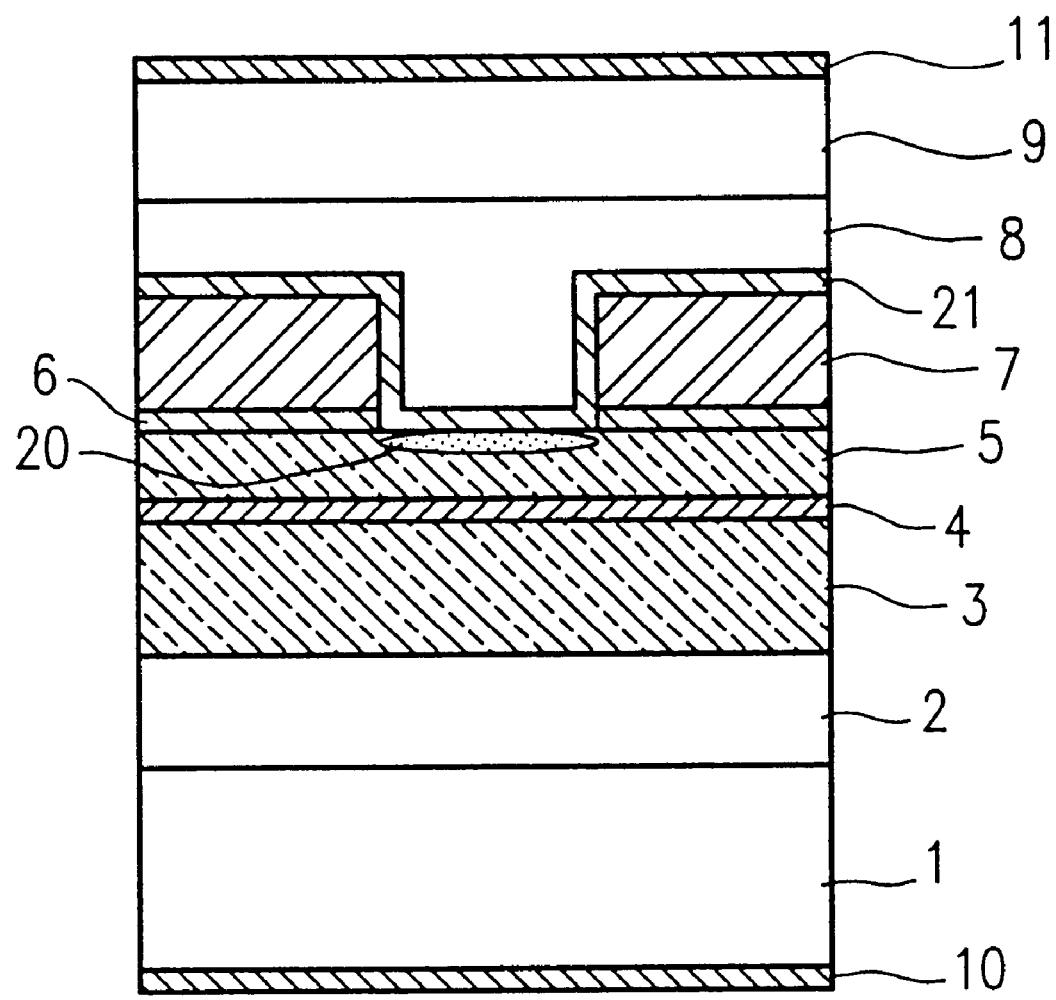
FIG. 13 is a schematic cross-sectional view showing a gallium nitride group compound semiconductor laser according to Example 7 of the present invention.

FIG. 13 shows a gallium nitride group compound semiconductor light-emitting device according to Example 7 of the present invention. The gallium nitride group compound semiconductor laser in Example 7 has the same structure as that in Example 5 and is fabricated by the MOCVD method. In Example 7, a low resistance P-type SiC substrate is used. Regarding a group V material, group III materials, a P-type impurity, an N-type impurity and carrier gases, the same materials as those in each of the above-described Examples are employed in Example 7.

Hereinafter, the production steps of the gallium nitride group compound semiconductor laser in Example 7 will be described with reference to FIGS. 14A to 14K.

First of all, in order to perform a first crystal growth, a low resistance P-type SiC substrate 1 is placed on the susceptor of the MOCVD apparatus. Then, the substrate temperature is raised to about 1200° C. and surface treatment is conducted.

Figure 14A:
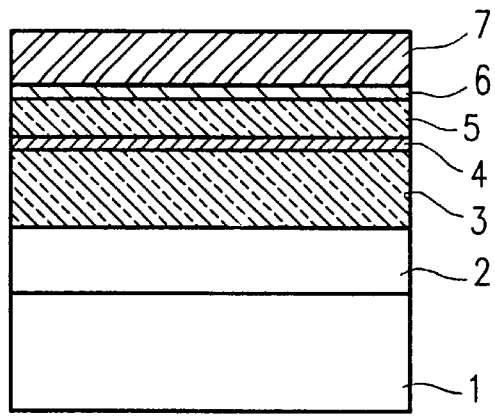

Next, the temperature of the low resistance P-type SiC substrate 1 is lowered to about 1050° C., and as shown in FIG. 14A, an Mg-doped GaN buffer layer 2 is grown on a top surface of the low resistance P-type SiC substrate 1 so as to have a thickness of about 0.5 to about 1 μm. Thereafter, an Mg-doped $Al_{0.1}Ga_{0.9}N$ cladding layer 3 is grown on the Mg-doped GaN buffer layer 2 so as to have a thickness of about 0.7 to about 1 μm. Then, the substrate temperature is lowered to be a temperature between about 800 and about 850° C., and an non-doped $In_{0.15}Ga_{0.85}N$ active layer 4 is grown so as to have a thickness of about 3 to about 80 nm. Then, while raising the substrate temperature to about 1050° C., an N-type $Al_{0.1}Ga_{0.9}N$ cladding layer 5 is grown so as to have a thickness of about 0.1 to about 0.3 μm. Next, the substrate temperature is lowered to be a temperature between about 800 and about 850° C., and an N-type InN re-evaporation layer 6 is grown so as to have a thickness of about 3 nm. Thereafter, the substrate temperature is lowered to about 400° C. and then, while raising the substrate temperature to be about 400 to about 1050° C., an Mg-doped $Al_{0.05}Ga_{0.95}N$ internal current constricting layer 7 is grown so as to have a thickness of about 0.5 μm.

The internal current constricting layer 7 may be a high resistance layer in which no current flows.

Figure 14B:
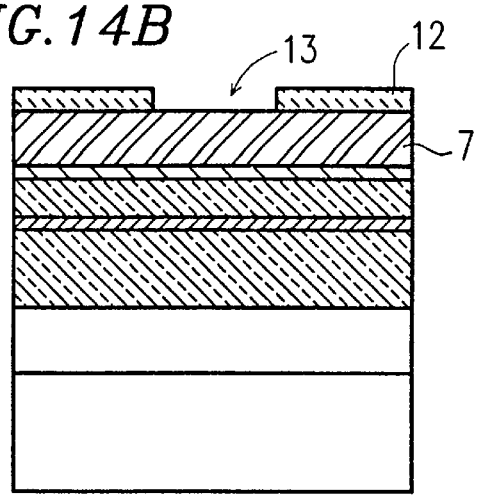

Next, the wafer is taken out from the growth chamber in the MOCVD apparatus. Then, an $SiO_X$ film, an $SiN_X$ film or a resist mask 12 is formed on the Mg-doped $Al_{0.05}Ga_{0.95}N$ internal current constricting layer 7. Then, as shown in FIG. 14B, a part of the $SiO_X$ film, the $SiN_X$ film or the resist mask 12 on the Mg-doped $Al_{0.05}Ga_{0.95}N$ internal current constricting layer 7 is removed using a common photolithography technique to form a stripe-shaped opening 13.

Figure 14C:
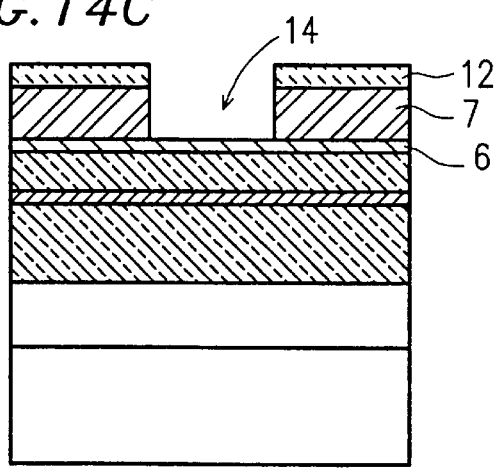

Then, the wafer is treated with wet etching or dry etching in an ambient atmosphere. As shown in FIG. 14C, the Mg-doped $Al_{0.05}Ga_{0.95}N$ internal current constricting layer 7 is etched to form a deeper opening 14 until a surface of the N-type InN re-evaporation layer 6 is exposed. The etching is performed by using, for example, a gas such as $BCl_3/Ar$ or $CCl_2F_2/Ar$ in the above-described ECR-RIBE method.

Figure 14D:
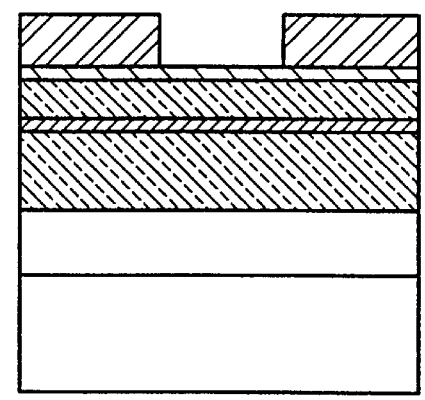

Next, as shown in FIG. 14D, the resist mask 12 is removed by a hydrofluoric acid group etching solution or an organic solvent.

Figure 14E:
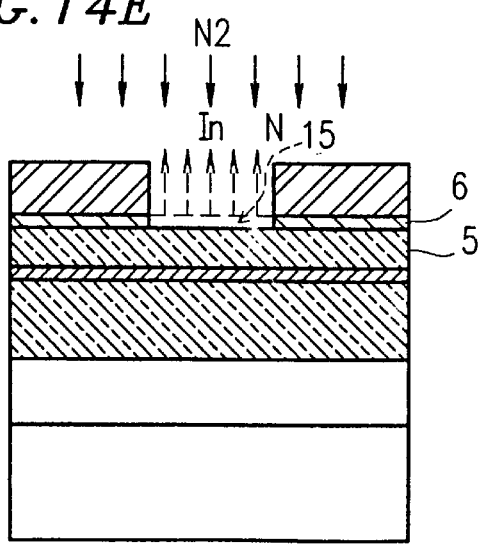
Figure 14F:
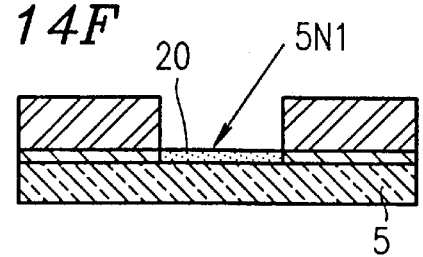

Thereafter, the wafer is again placed on the susceptor of the MOCVD apparatus. In an atmosphere including $N_2$ and $NH_3$, as shown in FIG. 14E, the N-type InN layer 6 is re-evaporated at a substrate temperature of about 550° C. so that a surface of the N-type $Al_{0.1}Ga_{0.9}N$ cladding layer 5 is exposed.

Then, an Si-heavily-doped region 20 is formed, for example, by: depositing several atomic layers of Si element on the exposed surface of the N-type $Al_{0.1}Ga_{0.9}N$ cladding layer 5 (5N1 in FIG. 14F); injecting ions thereto (5N2 in FIG. 14G); or providing an Si-heavily-doped $Al_{0.05}Ga_{0.95}N$ layer thereon (5N3 in FIG. 14H), at a predetermined temperature.

The carrier concentration of the Si-heavily-doped region 20 is preferably in the range of $1 \times 10^{18}$ to $1 \times 10^{19}$ cm$^{-3}$.

As an N-type impurity, disilane ($Si_2H_6$) which is a hydrogen diluting gas of hydride, hydrogen sulfide ($H_2S$), selenium sulfide ($H_2Se$), $GeH_4$, $SnH_4$, $TeH_4$, or the like, for example, may be employed. The substrate temperature for forming the N-type high impurity concentration region is preferably in the range of about 400 to about 800° C.

Next, a second crystal growth is performed. As shown in FIG. 14I, in order to prevent re-evaporation of Si from the Si-heavily-doped region on the exposed surface of the Si-doped $Al_{0.1}Ga_{0.9}N$ cladding layer 5, an Si-doped $Al_{0.05}Ga_{0.95}N$ impurity evaporation preventing layer 21 is laminated at a substrate temperature of about 400 to about 650° C. so as to have a thickness of about 10 to about 20 nm.

At this point, the impurity evaporation preventing layer 21 laminated at a low substrate temperature is in a polycrystalline state. However, during the step of raising the substrate temperature to cause regrowth of an N-type $Al_{0.1}Ga_{0.9}N$ cladding layer 8 on the impurity evaporation preventing layer 21, the impurity evaporation preventing layer 21 transforms from the polycrystalline state to the single crystalline state. Therefore, there are no significant adverse effects on the device characteristics.

Next, the substrate temperature is raised to about 1050° C., and as shown in FIG. 14J, the N-type $Al_{0.1}Ga_{0.9}N$ cladding layer 8 is grown so as to have a thickness of about 0.7 to about 1 μm. Then, an N-type contact layer 9 is grown thereon so as to have a thickness of about 0.5 to about 1 μm. During the step of raising the substrate temperature, Si is diffused into the N-type $Al_{0.1}Ga_{0.9}N$ cladding layer 5 from the Si-heavily-doped region 20 on the surface of the N-type cladding layer 5.

Then, the wafer is taken out from the MOCVD apparatus. In an $N_2$ atmosphere, the wafer is annealed at a temperature of about 800° C. so that the Mg-doped layers are transformed to be P-type. As shown in FIG. 14K, an N-side electrode 11 is formed on a top surface of the N-type GaN contact layer 9, and a P-side electrode 10 is formed on a bottom surface of the low resistance P-type SiC substrate 1.

In the above-described manner, the gallium nitride group compound semiconductor laser having the structure shown in FIG. 13 is completed.

The gallium nitride group compound semiconductor laser in Example 7 has the same device structure as those in Examples 5 and 6. Therefore, the same effect as those in Examples 5 and 6 can be obtained.

EXAMPLE 8

Figure 15:
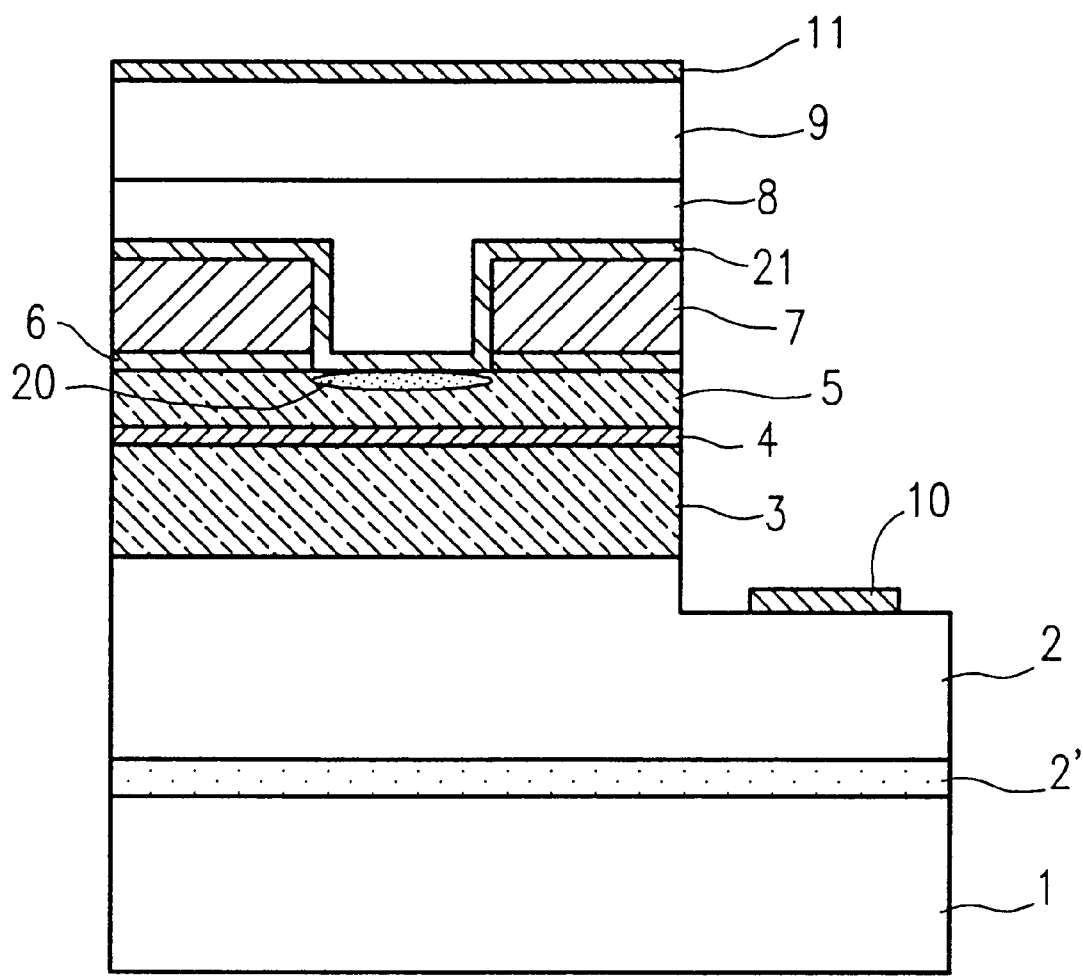
FIG. 15 is a schematic cross-sectional view showing a gallium nitride group compound semiconductor laser according to Example 8 of the present invention.

FIG. 15 shows a gallium nitride group compound semiconductor light-emitting device according to Example 8 of the present invention. The gallium nitride group compound semiconductor laser in Example 8 has the same structure as that in Example 6 and is fabricated by the MOCVD method. According to Example 8 of the present invention, a sapphire substrate is used, and regarding a group V material, group III materials, a P-type impurity, an N-type impurity, and carrier gases, the same materials as those in each of the above-described Examples are employed.

Hereinafter, the production steps of the gallium nitride group compound semiconductor laser will be described with reference to FIGS. 16A to 16K.

Figure 16A:
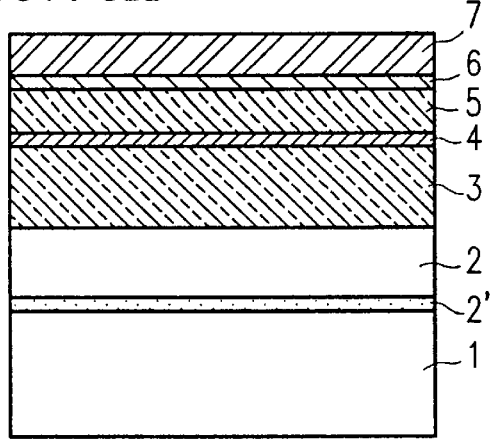

First of all, in order to perform a first crystal growth, a sapphire substrate 1 is placed on the susceptor of the MOCVD apparatus. Then, the substrate temperature is raised to about 1200° C. and surface treatment is conducted. Next, the temperature of the sapphire substrate 1 is lowered to be a temperature between about 500 and about 650° C., and as shown in FIG. 16A, a GaN buffer layer, an AlN buffer layer, or an $Al_{0.1}Ga_{0.9}N$ buffer layer 2' is grown on the sapphire substrate 1 so as to have a thickness of about 50 nm to about 2 μm.

Next, the substrate temperature is raised to about 1050° C. Thereafter, an Mg-doped GaN buffer layer 2 is grown so as to have a thickness of about 0.5 to about 1 μm. Then, an Mg-doped $Al_{0.1}Ga_{0.9}N$ cladding layer 3 is grown on the Mg-doped GaN buffer layer 2 so as to have a thickness of about 0.7 to about 1 μm. Next, the substrate temperature is lowered to be a temperature between about 400 and about 850° C., and an non-doped $In_{0.15}Ga_{0.85}N$ active layer 4 is grown so as to have a thickness of about 3 to about 80 nm.

Then, while raising the substrate temperature to about 1050° C., an N-type $Al_{0.15}Ga_{0.9}N$ cladding layer 5 is grown so as to have a thickness of about 0.1 to about 0.3 μm. Next, the substrate temperature is lowered to be a temperature between about 800 and about 850° C., and an N-type InN re-evaporation layer 6 is grown so as to have a thickness of about 3 nm. Thereafter, the substrate temperature is lowered to about 400° C. and then, while raising the substrate temperature to be about 400 to about 1050° C., an Mg-doped $Al_{0.05}Ga_{0.95}N$ internal current constricting layer 7 is grown so as to have a thickness of about 0.5 μm. The internal current constricting layer 7 may be a high resistance layer in which no current flows.

Figure 16B:
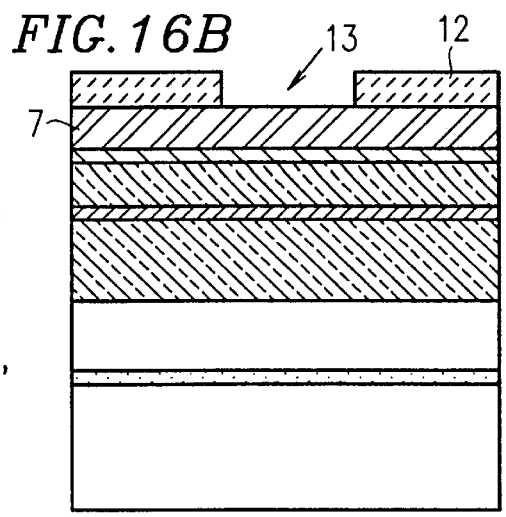

Next, the wafer is taken out from the growth chamber in the MOCVD apparatus. Then, an $SiO_X$ film, an $SiN_X$ film, or a resist mask 12 is formed on the Mg-doped $Al_{0.05}Ga_{0.95}N$ internal current constricting layer 7. Next, as shown in FIG. 16B, a part of the $SiO_X$ film, the $SiN_X$ film, or the resist mask 12 on the Mg-doped $Al_{0.05}Ga_{0.95}N$ internal current constricting layer 7 is removed using a common photolithography technique so as to form a stripe-shaped opening 13.

Figure 16C:
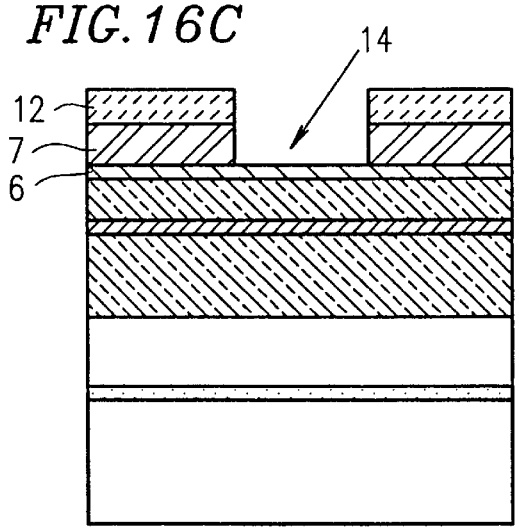

Then, the wafer is treated with wet etching or dry etching. As shown in FIG. 16C, the Mg-doped $Al_{0.05}Ga_{0.95}N$ internal current constricting layer 7 is etched to form a deeper opening 14 until a surface of the N-type InN re-evaporation layer 6 is exposed. The etching is performed, for example, by using a gas such as $BCl_3/Ar$ or $CCl_2F_2/Ar$ in the above-described RIE or ECR-RIBE method.

Thereafter, the resist mask 12 is removed by a hydrofluoric acid group etching solution or an organic solvent.

Figure 16D:
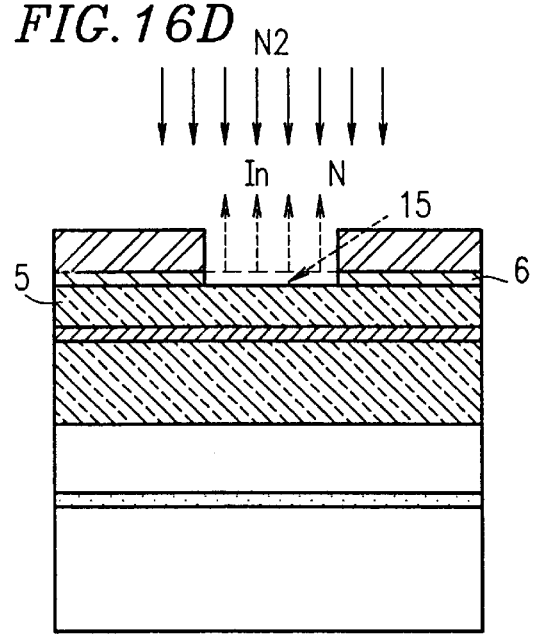
Figure 16E:
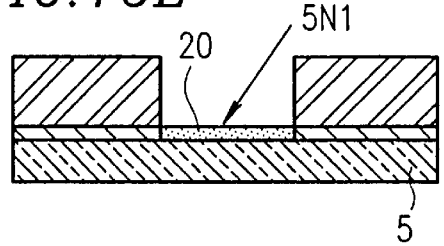
Figure 16F:
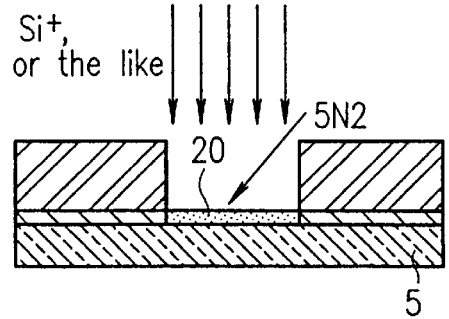
Figure 16G:
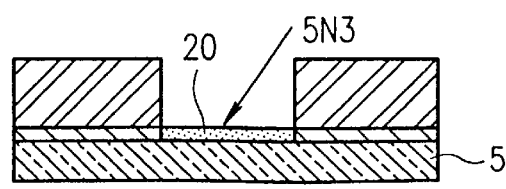

Then, the wafer is again placed on the susceptor of the MOCVD apparatus. In an atmosphere including $N_2$ and $NH_3$, as shown in FIG. 16D, the N-type InN layer 6 is selectively re-evaporated at a substrate temperature of about 550° C. so that a surface of the N-type $Al_{0.1}Ga_{0.9}N$ cladding layer 5 is exposed (an exposed portion 15 is thus formed).

Then, an Si-heavily-doped region 20 is formed, for example, by: depositing several atomic layers of Si element as an N-type impurity on the exposed surface of the N-type $Al_{0.1}Ga_{0.9}N$ cladding layer 5 (5N1 in FIG. 16E); injecting ions thereto (5N2 in FIG. 16F); or providing an Si-heavily-doped $Al_{0.05}Ga_{0.95}N$ layer thereon (5N3 in FIG. 16G), at a predetermined substrate temperature.

The preferable range of the carrier concentration in the Si-heavily-doped region 20, the N-type impurity and the preferable range of the substrate temperature, or the like in Example 8 are the same as those in Example 7.

Next, a second crystal growth is performed. As shown in FIG. 16H, in order to prevent the re-evaporation of Si from the Si-heavily-doped region 20 on the exposed surface of the Si-doped $Al_{0.1}Ga_{0.9}N$ cladding layer 5, an Si-doped $Al_{0.05}Ga_{0.95}N$ impurity evaporation preventing layer 21 is laminated at a substrate temperature of about 400 to about 650° C. so as to have a thickness of about 10 to about 20 nm. At this point, the evaporation preventing layer 21 laminated at a low substrate temperature is in a polycrystalline state. However, during the step of raising the substrate temperature to cause regrowth of an N-type $Al_{0.1}Ga_{0.9}N$ cladding layer 8 on the evaporation preventing layer 21, the impurity evaporation preventing layer 21 transforms from the polycrystalline state to the single crystalline state. Therefore, there are no significant adverse effects on the device characteristics.

Next, the substrate temperature is raised to about 1050° C. Then, as shown in FIG. 16I, the regrowth N-type $Al_{0.1}Ga_{0.9}N$ cladding layer 8 is grown so as to have a thickness of about 0.7 to about 1 μm, and an N-type GaN contact layer 9 is grown so as to have a thickness of about 0.5 to about 1 μm. During the step of raising the substrate temperature, Si deposited on the surface of the N-type cladding layer 5 is diffused into the N-type $Al_{0.1}Ga_{0.9}N$ cladding layer 5.

Next, the wafer is taken out from the MOCVD apparatus. In an $N_2$ atmosphere, the wafer is annealed at a temperature of about 800° C. so that the Mg-doped layers are transformed to be P-type. Then, in order to perform the attachment of a P-side electrode, as shown in FIG. 16J, etching 16 is performed until the P-type GaN layer 2 is exposed.

Then, as shown in FIG. 16K, an N-side electrode 11 is formed on a top surface of the N-type GaN contact layer 9, and a P-side electrode 10 is formed on the P-type GaN layer 2.

In the above-described manner, the gallium nitride group compound semiconductor laser having the structure shown in FIG. 15 is completed.

The gallium nitride group compound semiconductor laser in Example 8 has the same device structure as those in Examples 5, 6 and 7. Therefore, the same effects as those in Example 5, 6 and 7 can be obtained.

EXAMPLE 9

In the above-described Examples, the gallium nitride group compound semiconductor laser including the surface protecting layer 7' and the gallium nitride group compound semiconductor laser having the combination of the high impurity concentration region 20 and the impurity evaporation preventing layer 21 were described. However, the present invention can be also applied to a gallium nitride group compound semiconductor laser having the combination of the surface protecting layer 7' and the high impurity concentration region 20 and a gallium nitride group compound semiconductor laser having the combination of the surface protecting layer 7', the high impurity concentration region 20 and the impurity evaporation preventing layer 21.

According to the device structure having the combination of the surface protecting layer 7', the high impurity concentration region 20 and the impurity evaporation preventing layer 21, a highly reliable gallium nitride group compound semiconductor laser especially having excellent electrical characteristics can be realized due to the improved ability to surely prevent the escape of impurities.

EXAMPLE 10

Figure 17:
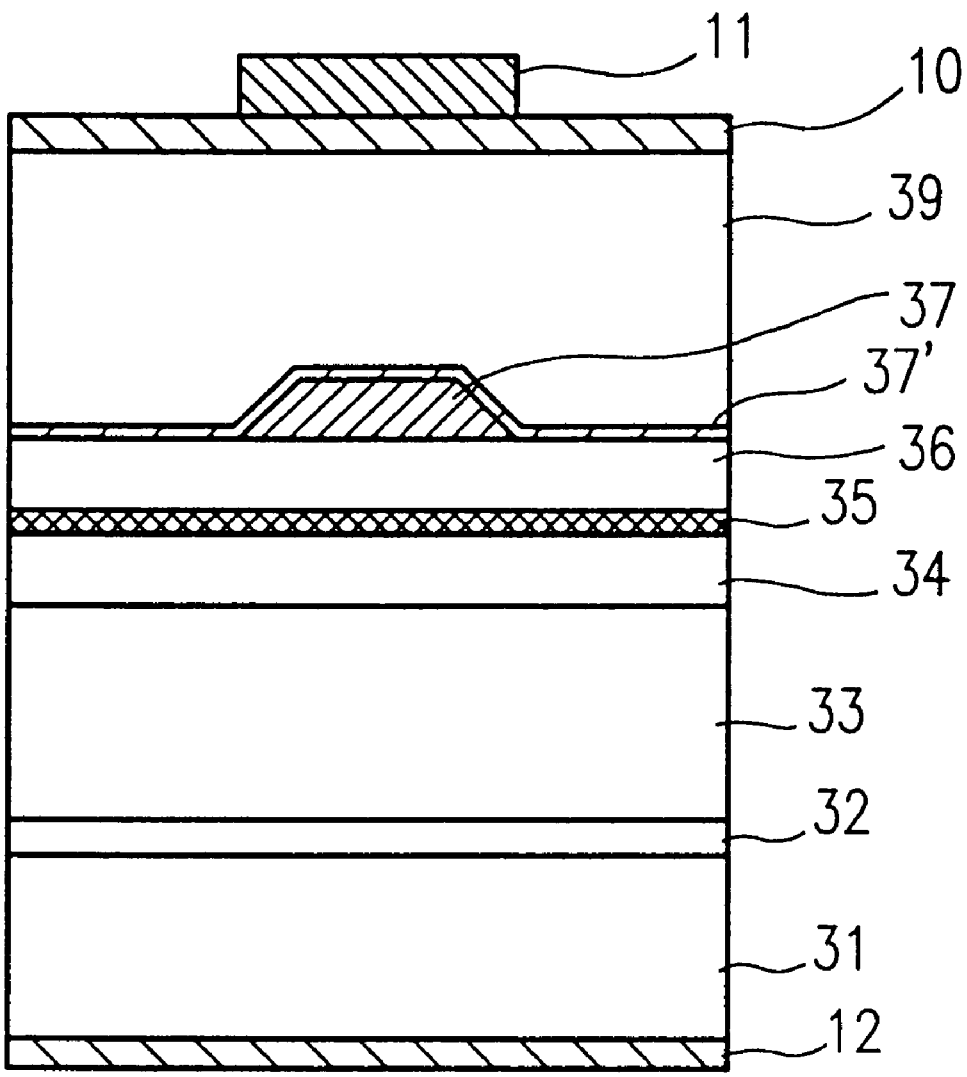
FIG. 17 is a schematic cross-sectional view showing a gallium nitride group compound light-emitting diode according to Example 10 of the present invention.

In Example 10, the present invention is applied to a gallium nitride group compound light-emitting diode. FIG. 17 shows the gallium nitride group compound light-emitting diode according to Example 10 of the present invention. The gallium nitride group compound light-emitting diode in Example 10 differs from the gallium nitride group compound semiconductor lasers in Examples 1 to 4 described above in the following point. While each of the gallium nitride group compound semiconductor lasers in Examples 1 to 4 has the internal current constricting layer 7, the gallium nitride group compound light-emitting diode in Example 10 has an internal current blocking layer 37 instead of the internal current constricting layer 7.

The gallium nitride group compound light-emitting diode also includes the surface protecting layer 37'. Due to the presence of the surface protecting layer 37', electrical and optical characteristics can be improved (for example, a reduction in the operating voltage, stabilization in the light emitting pattern, a reduction in the operating current, and the like) as in the above-described Examples. As a result, a highly-reliable gallium nitride group compound light-emitting diode can be realized.

As in the above-described Examples, the gallium nitride group compound light-emitting diode of this example is fabricated by the following MOCVD method. Regarding a group V material, group III materials and an N-type impurity, the same materials as those in the above-described Examples are employed.

Hereinafter, the production steps of the gallium nitride group compound light-emitting diode of this example will be described with reference to FIGS. 18A to 18F.

Figure 18A:
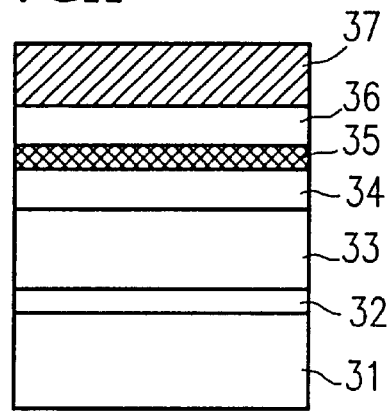
FIGS. 18A to 18F show production steps of the gallium nitride group compound light-emitting diode in FIG. 17 according to Example 10 of the present invention.

First of all, in order to perform a first crystal growth, an N-type SiC substrate 31 is placed on the susceptor of the MOCVD apparatus. Then, the substrate temperature is raised to about 1200° C. and surface treatment is conducted. Thereafter, the temperature of the N-type SiC substrate 31 is lowered to be a temperature between about 500 and about 650° C. Then, as shown in FIG. 18A, an N-type GaN buffer layer 32 is grown on the N-type SiC substrate 31 so as to have a thickness of about 10 to about 100 nm.

Thereafter, the substrate temperature is raised to about 1050° C. Next, an N-type GaN layer 33 is grown so as to have a thickness of about 0.5 to about 4 µm, and an N-type $Al_{0.1}Ga_{0.9}N$ cladding layer 34 is then grown so as to have a thickness of about 0.1 to about 0.3 µm. Thereafter, the substrate temperature is lowered to be a temperature between about 800 and about 850° C., and an non-doped $In_{0.15}Ga_{0.85}N$ active layer 35 is grown so as to have a thickness of about 3 to about 80 nm.

Subsequently, the substrate temperature is raised to about 1050° C. Then, an Mg-doped $Al_{0.1}Ga_{0.9}N$ cladding layer 36 is grown so as to have a thickness of about 0.1 to about 0.3 µm, and an N-type or a high resistance $Al_{0.05}Ga_{0.95}N$ internal current blocking layer 37 is grown so as to have a thickness of about 0.5 µm.

Figure 18B:
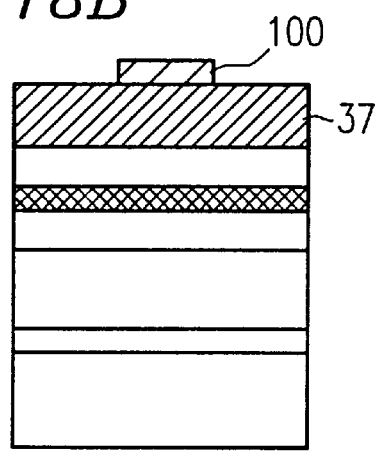

Next, the wafer is taken out from the growth chamber in the MOCVD apparatus. Then, an $SiO_X$ film, an $SiN_X$ film, or a resist mask 100 is formed on the N-type or the high resistance $Al_{0.05}Ga_{0.95}N$ internal current blocking layer 37. Then, as shown in FIG. 18B, a part of the $SiO_X$ film, the $SiN_X$ film, or the resist mask 100 on the N-type or the high resistance $Al_{0.05}Ga_{0.95}N$ internal current blocking layer 37 is removed using a common photolithography technique so as to leave, for example, a circle-shaped portion.

Figure 18C:
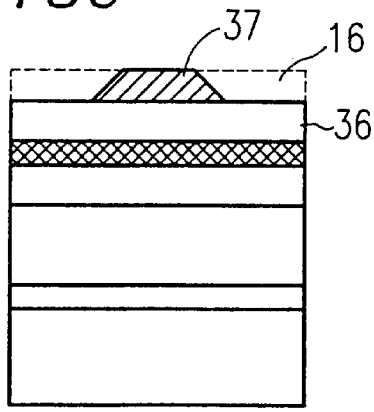

Next, the wafer is treated with wet etching or dry etching. As shown in FIG. 18C, the N-type or the high resistance $Al_{0.05}Ga_{0.95}N$ internal current blocking layer 37 is selectively etched (etching 16) until a surface of the Mg-doped $Al_{0.9}Ga_{0.9}N$ cladding layer 36 is exposed.

Then, the resist mask 100 is removed by a hydrofluoric acid group etching solution or an organic solvent.

Figure 18D:
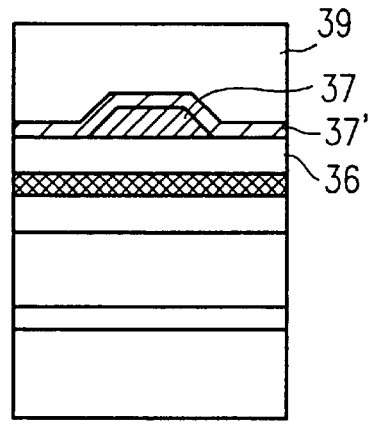

Next, in order to perform a second crystal growth, the wafer is again placed on the susceptor of the MOCVD apparatus. Then, at a substrate temperature of about 400 to about 650° C., as shown in FIG. 18D, an Mg-doped $Al_{0.05}Ga_{0.95}N$ surface evaporation protecting layer 37' is grown so as to have a thickness of about 20 to about 100 nm. Next, the substrate temperature is raised to about 1050° C., and an Mg-doped GaN contact layer 39 is grown so as to have a thickness of about 0.5 to about 1 µm.

At this point, the surface evaporation protecting layer 37' laminated at a low substrate temperature is in a polycrystalline state. However, during the step of raising the substrate temperature to cause regrowth of a P-type GaN contact layer 39 on the surface evaporation protecting layer 37', the surface evaporation protecting layer 37' transforms from the polycrystalline state to the single crystalline state. Therefore, there are no significant adverse effects on the device characteristics.

Figure 18E:
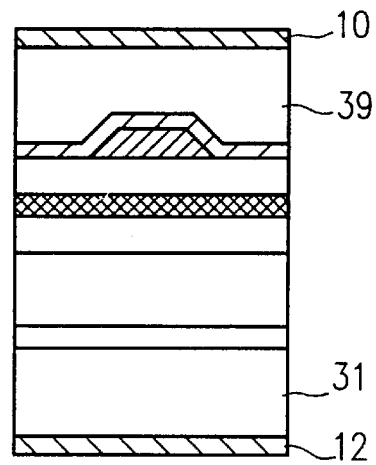

Then, the wafer is taken out from the MOCVD apparatus. In an $N_2$ atmosphere, the wafer is annealed at a temperature of about 800° C. so that the Mg-doped layers are transformed to be P-type. Then, as shown in FIG. 18E, a P-side electrode 10 is formed on a top surface of the P-type GaN contact layer 39, and an N-side electrode 12 is formed on a bottom surface of the N-type SiC substrate 31.

Figure 18F:
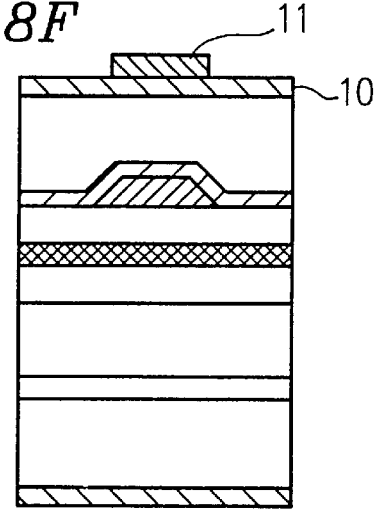
Figure 19:
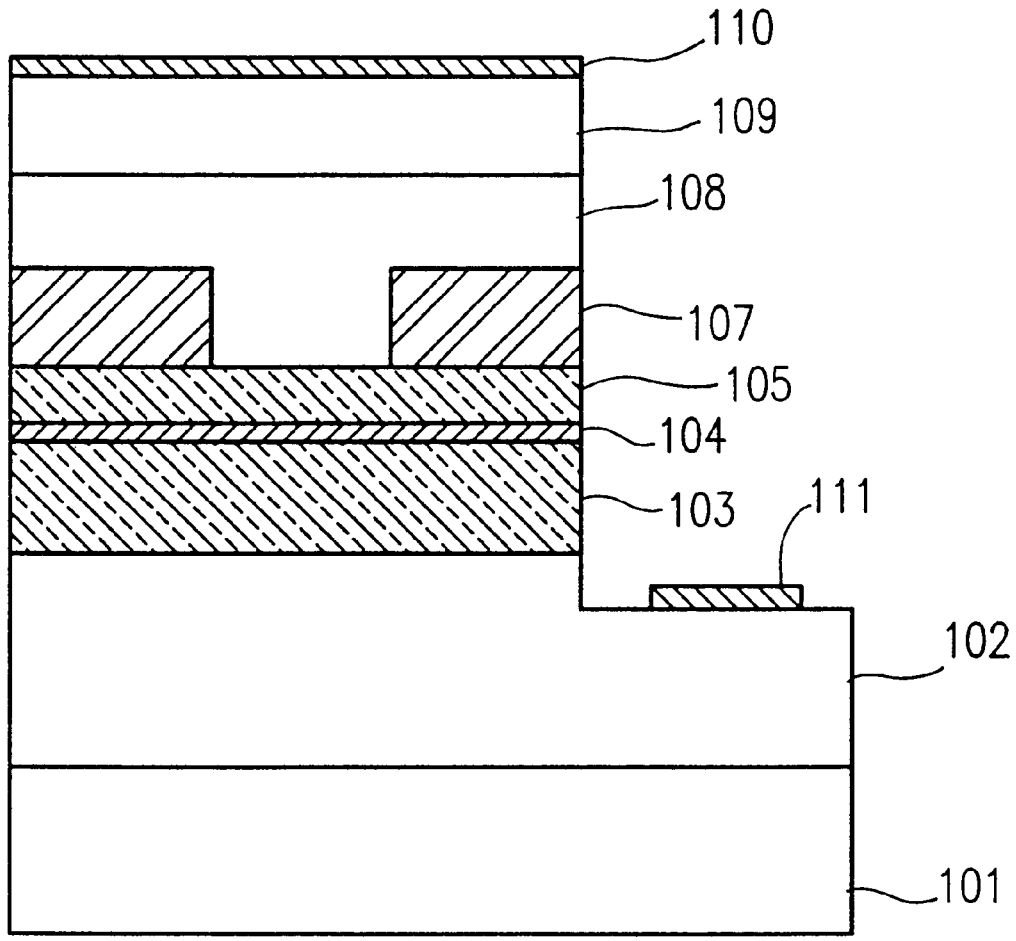
FIG. 19 is a schematic cross-sectional view showing a conventional gallium nitride group semiconductor laser.

Next, as shown in FIG. 18F, a bonding electrode 11 made of Au is formed at a desired position on the P-side electrode 10 so as to have a thickness of about 500 to about 800 nm.

In the above-described manner, the gallium nitride group compound light-emitting diode having the structure shown in FIG. 17 is completed.

Since the gallium nitride group compound light-emitting diode in Example 10 also includes the surface protecting layer 37' covering the exposed surface of the cladding layer 36 and the surface of the internal current blocking layer 37, the same effects as those in the above-described Examples can be obtained also in Example 10.

Regarding the substrate, composition ratio of each of the layers, and the like, a selection from those described in the above Examples and the combination thereof are possible.

In the above-described Examples 1 through 9, the present invention was applied to a gallium nitride group compound semiconductor laser. However, the present invention also can be applied to a gallium nitride group compound light-emitting diode.

The above-described present invention includes the surface protecting layer formed at a temperature in a range in which no deterioration in the decomposition efficiency of material gases is caused and also evaporation of the internal current constricting layer and the exposed surface of the underlying cladding layer is prevented. As a result, an impurity can be prevented from escaping from the underlying cladding layer, thereby causing no high resistance at the interface. Consequently, forward voltage can be reduced, and thus the electrical characteristics can be improved.

In addition, according to the present invention, an increase in surface roughness of the underlying cladding layer or the like can be prevented. As a result, crystallinity of the regrowth cladding layer becomes satisfactory, thereby making its surface condition satisfactory.

Moreover, according to the present invention, a deformation of the stripe-shaped opening and a change in the width of the stripe-shaped opening can be prevented. Thus, the optical characteristics can be improved.

Due to the reasons described above, the gallium nitride group compound semiconductor light-emitting device having the above-described structure can improve the electrical and optical characteristics (for example, a reduction in the operating voltage, stabilization of the light emitting pattern, a reduction in the threshold current, and the like), thereby improving its reliability.

Furthermore, according to the present invention, since the underlying cladding layer is protected from heat by the surface protecting layer, the composition ratio can be stabilized. Therefore, reliability can be further improved.

According to the present invention in which the high impurity concentration region is formed near the exposed surface of the underlying cladding layer and the evaporation preventing layer is formed so as to cover the internal current constricting layer and the exposed surface of the underlying cladding layer, an impurity can be prevented from evaporating in the gas phase from the high impurity concentration region. As a result, series resistance at the regrowth interface can be reduced. Consequently, even when the wafer is etched by photolithography in an ambient atmosphere to form the stripe-shaped opening and thus the current constricting layer with the stripe-shaped opening is formed, interface level is generated at the regrowth interface. As a result, series resistance at the regrowth interface is not increased.

Thus, a highly-reliable gallium nitride group compound semiconductor light-emitting device having: a low forward voltage and thus satisfactory electrical characteristics; and satisfactory regrowth interface can be realized.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride group compound semiconductor light-emitting device comprising a substrate and a layered structure provided on the substrate, the layered structure including:

an active layer;

an upper cladding layer and a lower cladding layer which is located closer to the substrate than the upper cladding layer, the active layer interposed between the cladding layers;

an internal current constricting layer having an opening for constricting a current within a selected region of the active layer, the internal current constricting layer being provided on the upper cladding layer;

a surface protecting layer for covering the internal current constricting layer and an exposed surface of the upper cladding layer in the opening of the internal current constricting layer, and a regrowth layer provided on the surface protecting layer, wherein the surface protecting layer serves as a protecting layer for the upper cladding layer and the internal current constricting layer in a step of forming the regrowth layer; and wherein a high impurity concentration region is provided near the exposed surface of the upper cladding layer in the opening; and wherein a re-evaporation layer having an opening in a region corresponding to the opening of the internal current constricting layer is provided between the upper cladding layer and the internal current constricting layer.

2. A gallium nitride group compound semiconductor light-emitting device according to claim 1, wherein the substrate is non-conductive, the lower cladding layer and the internal current constricting layer are of a first conductivity type, the upper cladding layer, the high impurity concentration region, the re-evaporation layer, and the surface protecting layer are of a second conductivity type, a buffer layer of the first conductivity type is provided between the substrate and the lower cladding layer, the regrowth layer includes a regrowth cladding layer of the second conductivity type, and a contact layer of the second conductivity type is provided on the regrowth cladding layer.

3. A gallium nitride group compound semiconductor light-emitting device according to claim 1, wherein, the substrate, the lower cladding layer, and the internal current constricting layer are of a first conductivity type, the upper cladding layer, the high impurity concentration region, the re-evaporation layer, and the surface protecting layer are of a second conductivity type, a buffer layer of the first conductivity type is provided between the substrate and the lower cladding layer, the regrowth layer includes a regrowth cladding layer of the second conductivity type, and a contact layer of the second conductivity type is provided on the regrowth cladding layer.

4. A gallium nitride group compound semiconductor light-emitting device according to claim 1 wherein, the surface protecting layer is made of $Al_tGa_{1-t}N$ ($0<t<1$), the re-evaporation layer is made of $In_zGa_{1-z}N$ ($0<z\leq 1$), the internal current constricting layer is made of $Al_wGa_{1-w}N$ ($0\leq w\leq 1$), the lower cladding layer and the upper cladding layer are made of $Al_xGa_{1-x}N$ ($0\leq x<1$), and the active layer is made of $In_yGa_{1-y}N$ ($0\leq y\leq 1$: when $x=0$, $y\neq 0$).

5. A gallium nitride group compound semiconductor light-emitting device according to claim 1, wherein the first conductivity type is an N-type, the second conductivity type is a P-type, and an impurity ion of the second conductivity type in the high impurity concentration region is selected from the group consisting of Mg and Zn.

6. A gallium nitride group compound semiconductor light-emitting device according to claim 1, wherein the first conductivity type is a P-type, the second conductivity type is an N-type, and an impurity ion of the second conductivity type in the high impurity concentration region is selected from the group consisting of Si, S, Se, Ge, Sn, and Te.

7. A gallium nitride group compound semiconductor light-emitting device comprising a substrate and a layered structure provided on the substrate, the layered structure including:

an active layer;

an upper cladding layer and a lower cladding layer which is located closer to the substrate than the upper cladding layer, the active layer interposed between the cladding layers;

an internal current constricting layer having an opening for constricting a current within a selected region of the active layer, the internal current constricting layer being provided on the upper cladding layer;

a surface protecting layer for covering the internal current constricting layer and an exposed surface of the upper cladding layer in the opening of the internal current constricting layer, and a regrowth layer provided on the surface protecting layer, wherein the surface protecting layer serves as a protecting layer for the upper cladding layer and the internal current constricting layer in a step of forming the regrowth layer; and wherein the surface protecting layer is made of $Al_tGa_{1-t}N$ ($0<t<0.5$).

8. A gallium nitride group compound semiconductor light-emitting device comprising a substrate and a layered structure provided on the substrate, the layered structure including:

an active layer;

an upper cladding layer and a lower cladding layer which is located closer to the substrate than the upper cladding layer, the active layer interposed between the cladding layers;

an internal current constricting layer having an opening for constricting a current within a selected region of the active layer, the internal current constricting layer being provided on the upper cladding layer;

a surface protecting layer for covering the internal current constricting layer and an exposed surface of the upper cladding layer in the opening of the internal current constricting layer, and a regrowth layer provided on the surface protecting layer, and wherein the surface protecting layer serves as a protecting layer for the upper cladding layer and the internal current constricting layer in a step of forming the regrowth layer; and wherein the surface protecting layer is made of $Al_tGa_{1-t}N$ (0.05<t<0.2).

9. A gallium nitride group compound semiconductor light-emitting device comprising a substrate and a layered structure provided on the substrate, the layered structure including:

an active layer;

an upper cladding layer and a lower cladding layer which is located closer to the substrate than the upper cladding layer, the active layer interposed between the cladding layers;

an internal current constricting layer having an opening for constricting a current within a selected region of the active layer, the internal current constricting layer being provided on the upper cladding layer;

a surface protecting layer for covering the internal current constricting layer and an exposed surface of the upper cladding layer in the opening of the internal current constricting layer, and a regrowth layer provided on the surface protecting layer, wherein the surface protecting layer serves as a protecting layer for the upper cladding layer and the internal current constricting layer in a step of forming the regrowth layer; and wherein the surface protecting layer serves to prevent impurity from evaporating in the gas phase from the upper cladding layer and also serves to prevent a surface roughness of the upper cladding layer and a deformation of the opening of the internal current constricting layer.

10. A gallium nitride group compound semiconductor light-emitting device comprising a substrate and a layered structure provided on the substrate, the layered structure including:

an active layer;

an upper cladding layer and a lower cladding layer which is located closer to the substrate than the upper cladding layer, the active layer interposed between the cladding layers;

an internal current constricting layer having an opening for constricting a current within a selected region of the active layer, the internal current constricting layer being provided on the upper cladding layer;

a surface protecting layer for covering the internal current constricting layer and an exposed surface of the upper cladding layer in the opening of the internal current constricting layer, and a regrowth layer provided on the surface protecting layer, wherein the surface protecting layer serves as a protecting layer for the upper cladding layer and the internal current constricting layer in a step of forming the regrowth layer; and wherein the surface protecting layer is formed at a temperature of about 400 to about 650° C. wherein no deterioration in a decomposition efficiency of material gases is caused and evaporation of the internal current constricting layer and the upper cladding layer is prevented.

* * * * *